(12) United States Patent
Machita et al.

(10) Patent No.: US 7,615,996 B1
(45) Date of Patent: Nov. 10, 2009

(54) EXAMINATION METHOD FOR CPP-TYPE MAGNETORESISTANCE EFFECT ELEMENT HAVING TWO FREE LAYERS

(75) Inventors: Takahiko Machita, Tokyo (JP); Kiyoshi Noguchi, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/320,152

(22) Filed: Jan. 21, 2009

(51) Int. Cl.
*G01R 33/09* (2006.01)
*G11B 5/39* (2006.01)

(52) U.S. Cl. .................................. 324/252; 428/811.2

(58) Field of Classification Search ............ 324/207.21, 324/252; 360/324–327; 365/8, 158; 428/811–811.3
See application file for complete search history.

(56) References Cited

U.S. PATENT DOCUMENTS

| | | | |
|---|---|---|---|
| 6,724,583 | B2 | 4/2004 | Seigler et al. |
| 7,019,371 | B2 | 3/2006 | Seigler et al. |
| 7,035,062 | B1 | 4/2006 | Mao et al. |
| 7,177,122 | B2 | 2/2007 | Hou et al. |
| 2008/0055791 | A1 * | 3/2008 | Katada et al. ............ 360/324.1 |

FOREIGN PATENT DOCUMENTS

JP  A-H06-150264  5/1994
JP  A-H06-314417  11/1994

OTHER PUBLICATIONS

U.S. Appl. No. 12/219,841, filed Jul. 29, 2009, Chou et al.
U.S. Appl. No. 11/946,358, filed Nov. 28, 2007, Shimazawa.

* cited by examiner

*Primary Examiner*—Bot L LeDynh
(74) *Attorney, Agent, or Firm*—Posz Law Group, PLC

(57) ABSTRACT

An examination method is structured, with respect to a magnetization direction of an orthogonalizing bias function part formed on a posterior part of an magnetoresistance (MR) effect element, of changing the magnetization direction of the orthogonalizing bias function part between a first magnetization forming mode, wherein the magnetization direction is from the anterior side of the element to the posterior side thereof, and a second magnetization forming mode, wherein the magnetization direction is from the posterior side of the element to the anterior side thereof, measuring the output waveform of the element in response to an external magnetic field for each magnetization forming mode and checking the state of the output waveforms of both modes in order to examine whether or not the magnetization directions of the first magnetic layer and the second magnetic layer, both of which functions as free layers, are antiparallel to each other in the track width direction before the orthogonalizing bias function part starts functioning. With the structure, it is realized to easily examine whether or not the magnetization directions of two free layers have surely been made antiparallel to each other before operating the orthogonalizing bias function part of an element.

15 Claims, 24 Drawing Sheets

FIG.1
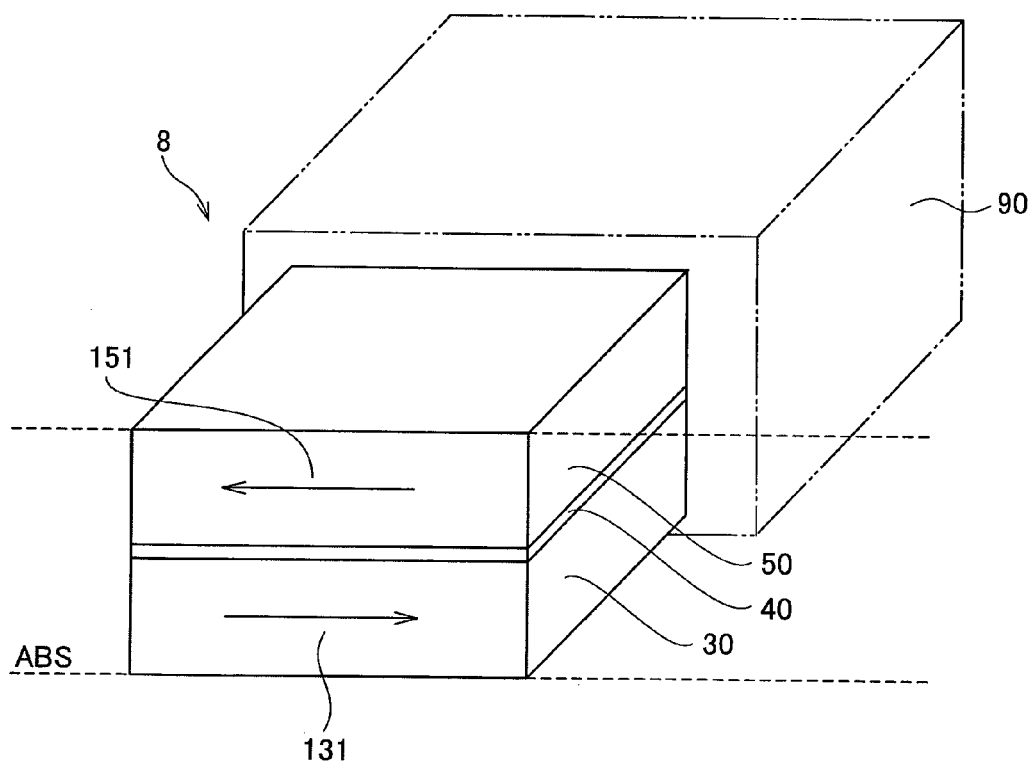
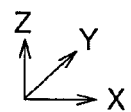

FIG. 9
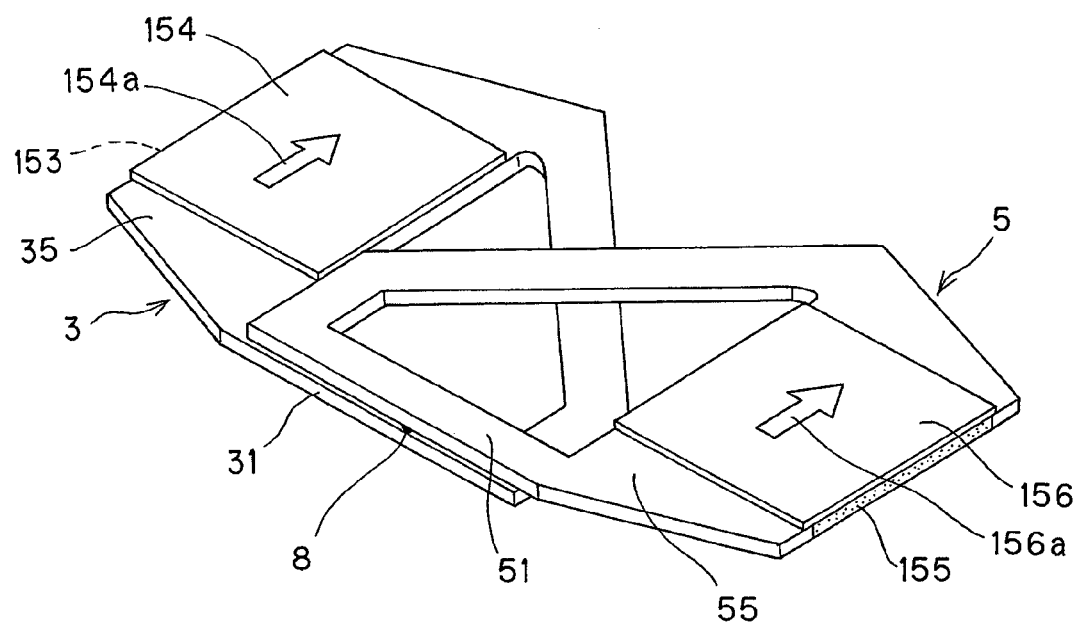
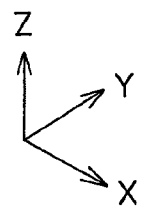

FIG.12
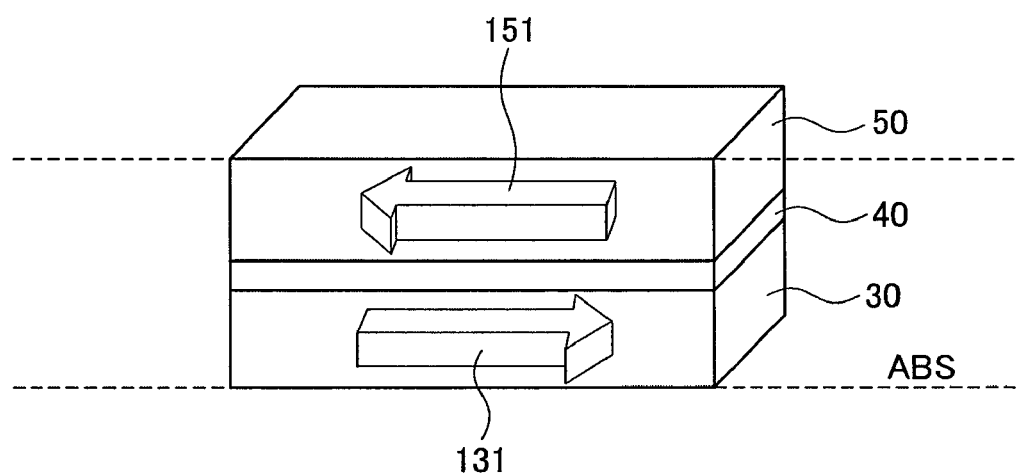
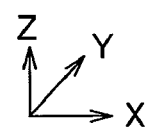

FIG.22
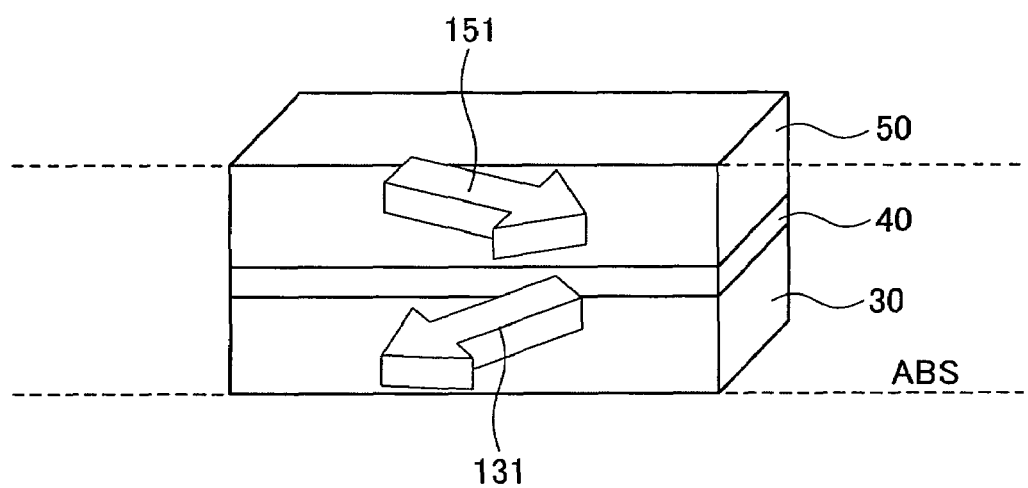
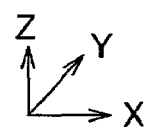

EXAMINATION METHOD FOR CPP-TYPE MAGNETORESISTANCE EFFECT ELEMENT HAVING TWO FREE LAYERS

TECHNICAL FIELD OF THE INVENTION

The present invention relates to an examination method for a CPP type magnetoresistance (MR) effect element having two free layers. Particularly, the present invention relates to an examination method that allows easily examining whether or not the magnetization directions of two free layers have been made antiparallel to each other before operating the orthogonalizing bias function part of an element. The orthogonalizing bias function part is disposed in a rear part of the two free layers and has influence over substantially orthogonalizing the magnetization directions of the two free layers.

BACKGROUND OF THE INVENTION

As the recording density of a hard disk drive (HDD) has lately been increasing, there is a need for enhancing the performance of a thin film magnetic head. As a thin film magnetic head, a complex type thin film magnetic head has widely been used that has a laminated structure of a reproducing head having a read-only magnetoresistance (MR) effect element (hereinafter also referred to as an MR element) and a recording head having a write-only induction-type magnetism conversion element.

As a reproducing head, an MR element having a so-called Current In Plane (CIP) structure has widely been used that operates by allowing an electric current to flow in parallel with the film surface of an element referred to as a spin bubble GMR element having a CIP structure (CIP-GMR element.) A spin bubble GMR element having such a structure is placed between upper and lower shield layers formed of soft magnetic metal films in a manner of being sandwiched between insulating layers referred to as gap layers. The recording density in the bit direction is decided by a gap (i.e., a shield gap or read gap length) between the upper and lower shield layers.

As the recording density increases, there is an increasing need for a narrower shield gap and track in the reproducing head of a reproducing element. As a result of a narrower track of a reproducing element and the reduction in the height of the element associated therewith, the area of the element decreases. The problem is that the operating current will be limited in the conventional structure in terms of reliability because the heat dissipating efficiency declines as the area decreases.

In order to solve the above-mentioned problem, a GMR element having a Current Perpendicular to Plane (CPP) structure has been proposed that eliminates the need for insulating layers between upper and lower shield layers (i.e., the upper part shield layer and the lower part shield layer), wherein the shield layers are electrically connected to an MR element in a series. This technology is vital to achieve such a high recording density that exceeds 200 Gbits/in$^2$.

Such a CPP-GMR element has a laminated structure containing a first ferromagnetic layer and a second ferromagnetic layer formed in a manner of sandwiching a conductive nonmagnetic middle layer from both sides. The typical spin bubble type CPP-GMR element has a sequentially laminated structure, from the substrate side, a lower electrode, a first ferromagnetic layer, a conductive nonmagnetic layer, a second ferromagnetic layer and an upper electrode.

The magnetization direction of the first ferromagnetic layer (or one of the ferromagnetic layers) is pinned in such a way as to become perpendicular to the magnetization direction of the second ferromagnetic layer at a time when the externally applied magnetic field is zero. The magnetization of the first ferromagnetic layer can be pinned by making an antiferromagnetic layer adjacent thereto and providing unidirection anisotropic energy (also referred to as "exchange bias" or "coupled magnetic field") to the first ferromagnetic layer by means of exchange-coupling between the antiferromagnetic layer and the first ferromagnetic layer. For this reason, the first ferromagnetic layer is also referred to as a magnetically pinned layer. On the other hand, the second ferromagnetic layer is referred to as a free layer as well. Moreover, the formation of the magnetically pinned layer (i.e., the first ferromagnetic layer) having a three-layer structure of a ferromagnetic layer/a nonmagnetic metal layer/a ferromagnetic layer (so-called "a laminated ferrostructure" or "a synthetic pinned structure") allows not only providing strong exchange-coupling between the two ferromagnetic layers and effectively increasing the exchange-coupling force applied from the antiferromagnetic layer but also decreasing the influence of a static magnetic field generated from the magnetically pinned layer on the free layer. Therefore, the "synthetic pinned structure" has widely been used lately.

Nevertheless, there remains a need for further thinning an MR element in order to meet the recent demand for extra high recording density. In such circumstances, novel GMR element structures have been proposed that have a simple three-laminated layer structure of a ferromagnetic layer (free layer)/a nonmagnetic middle layer/a ferromagnetic layer (free layer) as the basic structure as disclosed in U.S. Pat. No. 7,019,371 B2, U.S. Pat. No. 7,035,062 B1, U.S. Pat. No. 7,177,122 B2, etc.

In this application, such a structure is conveniently referred to as a DFL (dual free layer) element structure as well. In the DFL element structure, magnetizations of two ferromagnetic layers (free layers) are exchange-coupled in a manner of being antiparallel to each other. Moreover, a magnet is disposed on the back area opposite to the air bearing surface or ABS, which corresponds to the medium-opposed surface (or air-bearing-surface, ABS) of an element, and the initial state is created using a bias magnetic field generated from the magnet in which each magnetization direction of the two magnetic layers (free layers) tilt about 45 degrees relative to the track width direction (initial state).

At a time when an element in the initial magnetization state detects a signal magnetic field from a medium, the magnetization directions of the two magnetic layers change in a scissor-like action like a pair of scissors cuts paper. As a result, a resistance value of the element changes.

The application of such a DFL element structure to a so-called TMR element or CPP-GMR element allows more narrowing of the "read gap length," a gap between upper and lower shield layers, compared with a conventional general-type spin bubble type CPP-GMR element. More specifically, the above-mentioned antiferromagnetic layer that is required for a general spin bubble type CPP-GMR element is no longer needed. Nor is the ferromagnetic layer of the above-mentioned "synthetic pinned structure" needed any longer. As a result, it is possible to reduce the "read gap length," the limit of which is conventionally believed to be 30 nm, to not more than 20 nm.

In order to form the DFL element structure, the magnetization directions of two ferromagnetic layers (free layers) need to be antiparallel to each other in the track width direction before a bias magnetic field is applied from a bias magnet disposed in the back area opposite to the ABS that corresponds to the ABS.

The first method for making the magnetization directions of the two ferromagnetic layers (free layers) antiparallel to each other is a method of using exchange-coupling so that the magnetization directions of the two ferromagnetic layers (free layers) are antiparallel to each other. For example, it is easily accomplished by inserting rare metal such as Au, Ag, Cu, Ir, Rh, Ru, Cr or the like into the gap between the two ferromagnetic layers (free layers) so that exchange-coupling can be generated between the two ferromagnetic layers.

However, there is an inconvenience in a TMR element that strong exchange-coupling cannot be produced between two ferromagnetic layers because an insulating layer such as an aluminum oxide ($AlO_x$) film and a magnesium oxide (MgO) film must be placed between the two ferromagnetic layers (free layers) in order to produce the tunnel effect. As a result, it is extremely difficult to make the magnetization directions of the two ferromagnetic layers (free layers) antiparallel to each other.

The second method for making the magnetization directions of the two ferromagnetic layers (free layers) antiparallel to each other by overcoming the above-mentioned problem is disclosed in applicant's pending application, U.S. Ser. No. 11/946,358. This proposal allows achieving the antiparallel magnetic state of two ferromagnetic layers (free layers) with a simple structure without being restricted by the material or special structure of a middle film placed between the two ferromagnetic layers (free layers). As a result, not only can the recording density be increased by selecting a structure that allows narrowing the "read gap length" (i.e., a gap between upper and lower shield layers), but a stable change in the MR effect can also be achieved.

Furthermore, the third method for making the magnetization directions of two ferromagnetic layers (free layers) antiparallel to each other is disclosed in applicant's pending application, U.S. Ser. No. 12/219,841. According to this method, the magnetization of a shield layer controlled by pinning by an antiferromagnetic layer provided adjacent thereto is used for the antiparallel magnetization of the two magnetic layers.

Thus, there are various methods for forming the antiparallel state of two ferromagnetic layers (free layers) in the so-called DFL element structure. In any method, the magnetization directions of two ferromagnetic layers (free layers) need to be antiparallel to each other in the track width direction before a bias magnetic field is applied from a bias magnet disposed in the back area opposite to the ABS that corresponds to the medium-opposed surface.

However, no proposal has been made for an examination method for assuring that the magnetization directions of two ferromagnetic layers (free layers) are antiparallel to each other in the track width direction.

In these circumstances, the present invention was made. The object of the present invention is to provide a novel examination method that allows easily examining whether or not the magnetization directions of two free layers have surely been made antiparallel to each other before operating the orthogonalizing bias function part of an element, the orthogonalizing bias function part being disposed in the rear part of the two free layers and having influence over orthogonalizing the magnetization directions of the two free layers.

SUMMARY OF THE INVENTION

In order to solve the above-mentioned problems, the present invention is an examination method for a magnetoresistance (MR) effect element including an MR effect part having a non magnetic middle layer, a first ferromagnetic layer that functions as a free layer and a second ferromagnetic layer that functions as a free layer, wherein the first and second ferromagnetic layers are laminated in a manner of sandwiching the nonmagnetic middle layer, the MR element including a Current Perpendicular to Plane (CPP) structure, wherein a sense current is applied to the MR effect part in the laminating direction, and wherein an orthogonalizing bias function part is formed on a rear part of the MR effect part in order to influence the action of substantially orthogonalizing the magnetization directions of the first ferromagnetic layer and the second ferromagnetic layer, the examination method being structured for: changing the magnetization direction of the orthogonalizing bias function part between a first magnetization forming mode, wherein the magnetization direction is from the anterior side of the element to the posterior side thereof, and a second magnetization forming mode, wherein the magnetization direction is from the posterior side of the element to the anterior side thereof, measuring the output waveform of the element in response to an external magnetic field for each magnetization forming mode, and checking the state of the output waveforms of both modes in order to examine whether or not the magnetization directions of the first magnetic layer and the second magnetic layer, both of which functions as free layers, are antiparallel to each other in the track width direction before the orthogonalizing bias function part starts functioning.

Also, a preferred embodiment of the present invention is the examination method for the MR effect element, wherein examining whether or not the magnetization directions of the first ferromagnetic layer and the second ferromagnetic layer, both of which functions as free layers, are antiparallel to each other in the track width direction before the orthogonalizing bias function part starts functioning by checking the asymmetry of the output waveform for each mode.

Also, a preferred embodiment of the present invention is the examination method for the MR effect element, wherein examining whether or not the magnetization directions of the first ferromagnetic layer and the second ferromagnetic layer, both of which functions as free layers, are antiparallel to each other in the track width direction before the orthogonalizing bias function part starts functioning by drawing graphs of output waveforms for both modes at the same time, integrating them and then judging whether or not the integrated graphs are symmetry (i.e., whether or not there is a mirror-image relationship) using as reference the longitudinal axis where the applied magnetic field is zero.

Also, a preferred embodiment of the present invention is the examination method for the MR effect element, wherein the examination is conducted up to the wafer processing completion state for a plurality of specific MR elements selected as examination objects from a group of MR elements disposed and formed on a wafer substrate in the matrix state.

Also, a preferred embodiment of the present invention is the examination method for the MR effect element, wherein a group of MR elements disposed and formed on a wafer substrate in the matrix state is cut into multiple bars, and then the examination is conducted, in the cutout bar state, for a plurality of specific MR elements selected as examination objects from a group of the MR elements in a cutout bar.

Also, a preferred embodiment of the present invention is the examination method for the MR effect element, wherein the examination is conducted for a slider (or in a slider state) including one MR element.

Also, a preferred embodiment of the present invention is the examination method for the MR effect element, wherein the examination is conducted for a head gimbal assembly including a slider containing one MR element and a suspension that elastically supports the slider.

Also, as a preferred embodiment of the present invention is the examination method for the MR effect element, wherein a first magnetization mode from the anterior side of the element to the posterior side thereof is structured so that the magnetized magnetization direction is oriented toward the posterior side, back area of the element, from an air-bearing-surface (ABS), and wherein a second magnetization mode from the posterior side of the element to the anterior side thereof is structured so that the magnetized magnetization direction is oriented toward the ABS from the posterior side, back area of the element.

Also, as a preferred embodiment of the present invention is the examination method for the MR effect element, wherein the magnetization directions of the first magnetization mode from the anterior side of the element to the posterior side thereof and the second magnetization mode from the posterior side of the element to the anterior side thereof are perpendicular to the ABS.

Also, as a preferred embodiment of the present invention is the examination method for the MR effect element, wherein the first ferromagnetic layer that functions as a free layer and the second ferromagnetic layer that functions as a free layer are exchange-coupled via the nonmagnetic middle layer so that their magnetization directions are antiparallel to each other.

Also, as a preferred embodiment of the present invention is the examination method the MR effect element, wherein the magnetization directions of the first ferromagnetic layer that functions as a free layer and the second ferromagnetic layer that functions as a free layer are controlled by a magnetization direction control part of the first ferromagnetic layer and another magnetization direction control part of the second ferromagnetic layer respectively disposed on the upper and lower portions of the MR effect part, so that the magnetization directions of the first ferromagnetic layer and the second ferromagnetic layer are substantially antiparallel to each other.

Also, as a preferred embodiment of the present invention is the examination method for the MR effect element, wherein the orthogonalizing bias function part is structured of a hard magnet, and a magnetization operation is used as a method for changing the magnetization direction between the first magnetization forming mode and the second magnetization forming mode.

Also, as a preferred embodiment of the present invention is the examination method for the MR effect element, wherein the orthogonalizing bias function part is structured of a laminated body including an antiferromagnetic layer and a ferromagnetic layer, and the annealing process in the magnetic filed is used as a method for changing the magnetization direction between the first magnetization forming mode and the second magnetization forming mode.

Also, as a preferred embodiment of the present invention is the examination method for the MR effect element, wherein the magnetization directions of the first magnetization forming mode and the second magnetization forming mode are opposite relative to one another.

The examination method of a magnetic head according to the present invention is an examination method for a magnetic head containing the above-mentioned MR element, the examination being structured in a manner of conducting an examination for an MR element constituting a magnetic head in the above-mentioned manner.

BRIEF DESCRIPTION OF THE DRAWINGS

FIG. 1 is a perspective view schematically showing the structure of the main part of an MR element, an examination object.

FIG. 9 is a perspective view exemplifying the further developed constitution of a first shield layer and a second shield layer as a third mode.

FIG. 12 is a perspective view showing the state of a well structured element in which the magnetization directions of a first ferromagnetic layer and a second ferromagnetic layer are antiparallel to each other in the track width direction.

FIG. 22 is a perspective view showing the state of another element of defective quality in which the magnetization directions of a first ferromagnetic layer and a second ferromagnetic layer are not antiparallel to each other in the track width direction.

DETAILED EXPLANATION OF THE INVENTION

Figure 2:
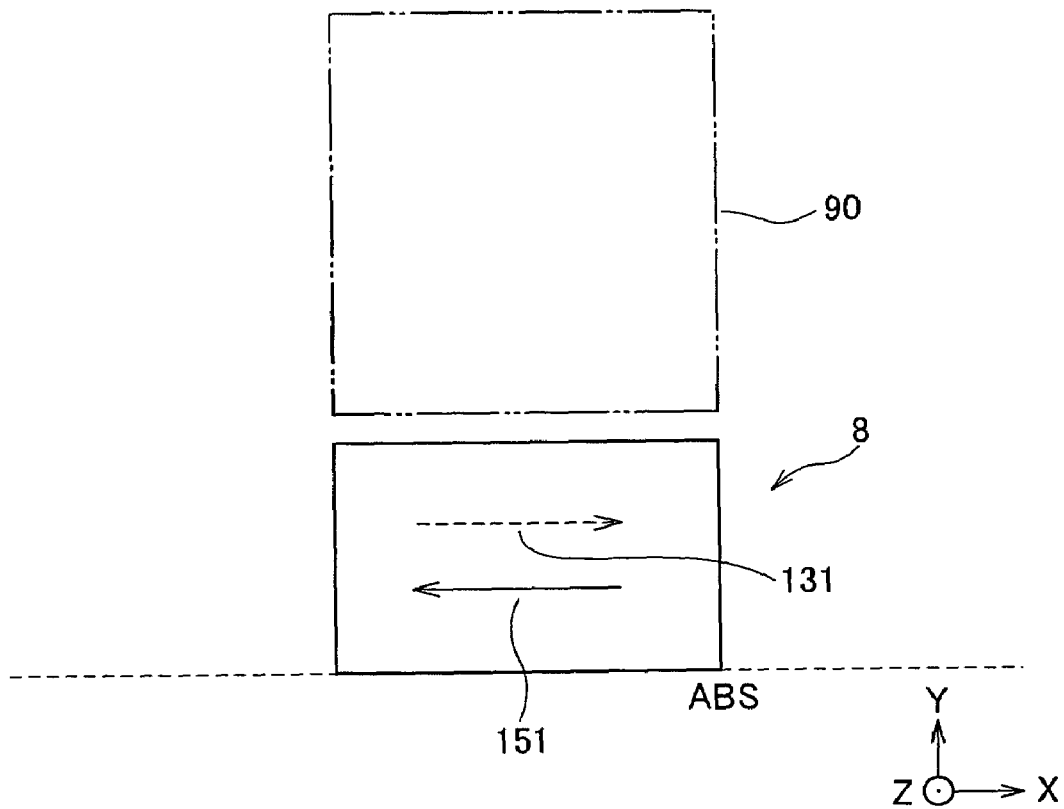
FIG. 2 is a plan view taken by the X-Y plane as seen from above in FIG. 1.

A description of the best mode for implementing the present invention is given below in detail.

The object of the examination (or examination object) method for an MR element according to the present invention is an MR element satisfying the following conditions. In other words, the object of the examination method according to the present invention is an MR element containing an MR effect part having a nonmagnetic middle layer, a first ferromagnetic layer that functions as a free layer and a second ferromagnetic layer that functions as a free layer, wherein the first and second ferromagnetic layers are laminated in a manner of sandwiching the nonmagnetic middle layer, the MR element having a CPP structure, wherein a sense current is applied to the MR effect part in the laminating direction, and wherein an orthogonalizing bias function part is disposed and formed on the rear part of the MR effect part in order to influence the action of substantially orthogonalizing the magnetization directions of the first ferromagnetic layer and the second ferromagnetic layer.

In such an MR element, it is required that the magnetization directions of the two free layers should be antiparallel to each other in the track width direction before the orthogonalizing bias function part starts functioning (i.e., before a bias is applied). Accordingly, the examination according to the present invention is to examine whether or not the magnetization directions of the two free layers are antiparallel to each other in the track width direction before the orthogonalizing bias function part starts its original function (i.e., before a bias is applied).

More specifically, the examination is conducted by changing the magnetization direction of the orthogonalizing bias function part between a first magnetization mode, wherein the magnetization direction is from the anterior side of the element to the posterior side thereof, and a second magnetization mode, wherein the magnetization direction is from the posterior side of the element to the anterior side thereof, measuring the output waveform of the element in response to an external magnetic field for each magnetization mode and checking the state (asymmetry) of the output waveforms of both modes. As used herein, the phrase "before the orthogonalizing bias function part starts its original function" refers to the state in which the orthogonalizing bias function part has not been magnetized by magnetization or the like yet (or a bias has not been applied yet). Accordingly, in this state, the magnetization directions of the two free layers have not been influenced by the orthogonalizing bias function part yet.

First, a description of an MR element, an examination object of the present invention, is given below in detail before the examination method according to the present invention for the MR element is explained in detail.

In the following explanation, the size in the direction of the X-axis in the drawings, the size in the direction of the Y-axis and the size in the direction of the Z-axis are described as "width," "length" and "thickness," respectively.

In the direction of the Y-axis, the side close to the air bearing surface (It is a surface of a thin film magnetic head side opposed to recording medium, it is sometimes referred as ABS,) and its opposite side (back side) are described as "anterior (front)" and "posterior (rear)," respectively. The sequential layering direction of a laminated layer and its opposite direction are referred to as "upward" or "up side" and "downward" or "down side," respectively.

[Explanation of an MR Element, an Examination Object]

As shown in the schematic view in FIG. 1, an MR element that is an examination object (or object to be examined) has an MR effect part 8 having a non magnetic middle layer 40, a first ferromagnetic layer 30 that functions as a free layer and a second ferromagnetic layer 50 that functions as a free layer, wherein the first and second ferromagnetic layers are laminated in a manner of sandwiching the nonmagnetic middle layer 40. The MR element has a CPP structure, wherein a sense current is applied to the MR effect part in the laminating direction, and wherein an orthogonalizing bias function part 90 is formed on the rear part of the MR effect part 8 in order to influence the action of substantially orthogonalizing the magnetization directions of the first ferromagnetic layer 30 and the second ferromagnetic layer 50.

In such an MR element, as shown in FIG. 1, the magnetization direction 131 of the first ferromagnetic layer 30 (free layer 30) and the magnetization direction 151 of the second ferromagnetic layer 50 (free layer 50) are ideally antiparallel to each other in the track width direction (i.e., the X-axis direction in the drawing) before the orthogonalizing bias function part 90 starts functioning.

A description of the meaning of the antiparallel state and the detecting operation of an exterior magnetic field is given below by referring to FIG. 2~FIG. 5.

As shown in FIG. 2, before the orthogonalizing bias function part 90 starts its function, i.e., before any magnetization operation (e.g., polarization operation), the antiparallel state is formed between the first ferromagnetic layer 30 and the second ferromagnetic layer 50, wherein the magnetization directions 131 and 151 of the magnetic layers 30 and 50, respectively, are opposite each other. There are several methods for forming the antiparallel state in which the magnetization directions 131 and 151 become opposite to each other. These specific methods will be described below.

Figure 3:
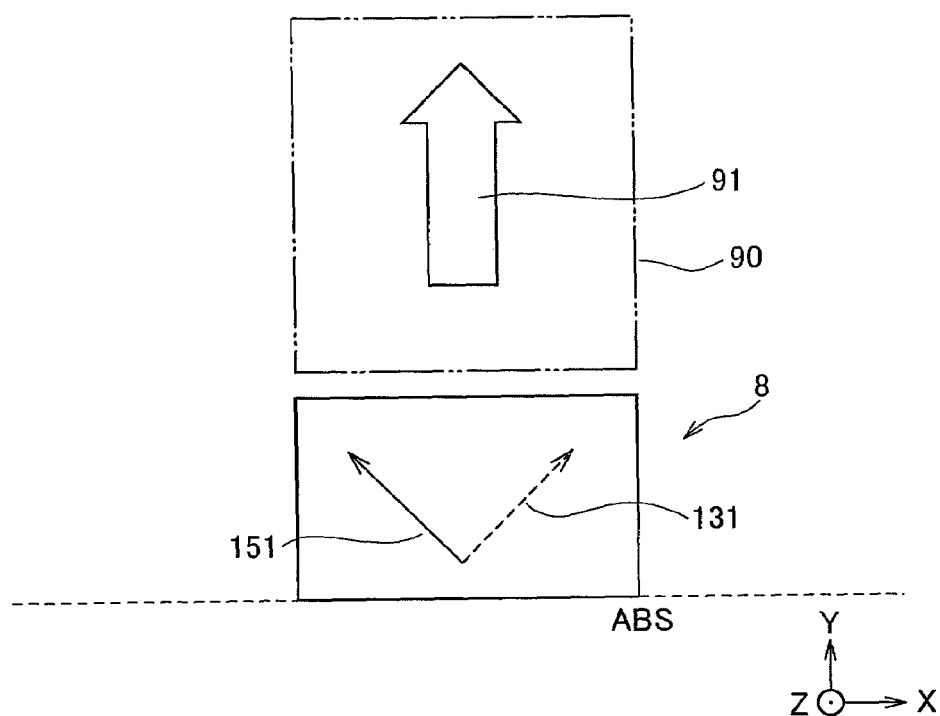
FIG. 3 is a plan view taken by the X-Y plane as seen from above in FIG. 1, which is a model diagram showing the state change of magnetization in response to an external magnetic field that shows the MR effect change of an MR element according to the present invention.

As shown in FIG. 3, the orthogonalizing bias function part 90 placed on the posterior side of the first ferromagnetic layer 30 and the second ferromagnetic layer 50 (i.e., back area in the Y direction) is magnetized (e.g., polarized) from the ABS that is the medium-opposed surface toward the back area side in the Y direction. This is referred to as "ABS in magnetization." The magnetization direction 91 is perpendicular to the ABS toward the back area side. By this magnetization (e.g., polarization), the magnetization directions 131 and 151 of the first ferromagnetic layer 30 and the second ferromagnetic layer 50, respectively, that have been antiparallel to each other are tilted about 45 degrees relative to the track width direction (i.e., the X-axis direction in the drawing) to make the first state (initial state). Accordingly, the magnetization directions 131 and 151 are substantially orthogonal to each other. As used herein, "substantially orthogonal" refers to the range of 90 degrees+/−20 degrees. Ideally, 90 degrees is preferable.

Figure 4:
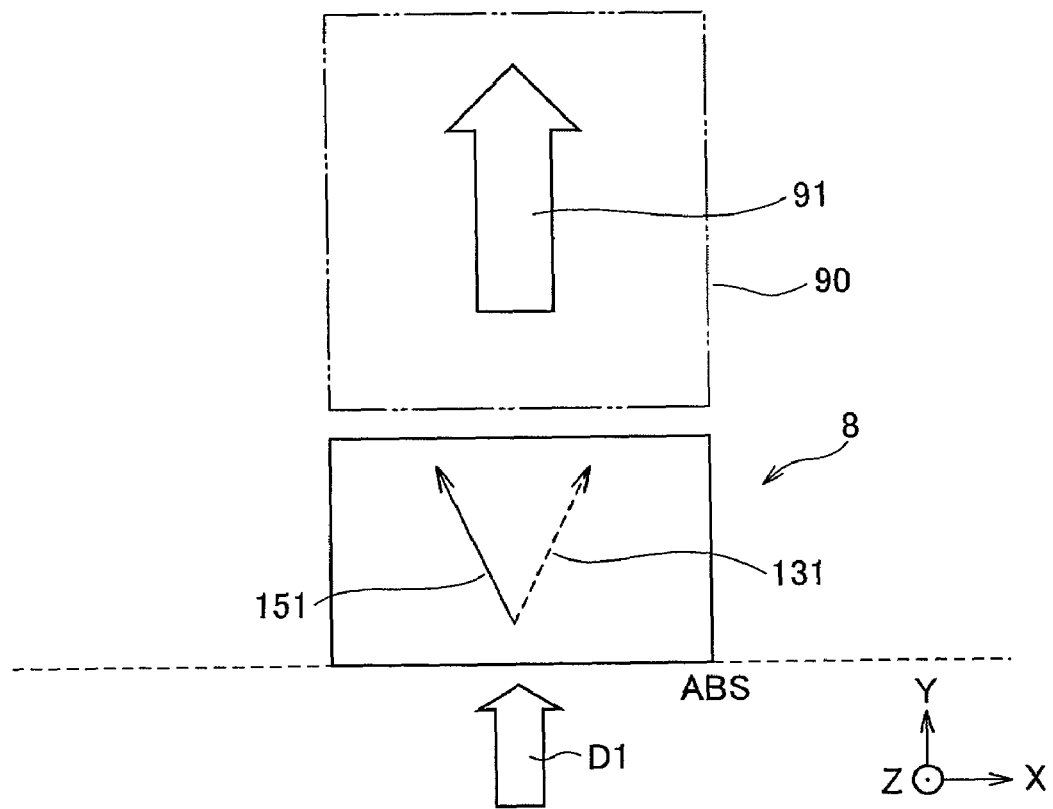
FIG. 4 is a plan view taken by the X-Y plane as seen from above in FIG. 1, which is a model diagram showing the state change of magnetization in response to an external magnetic field that shows the MR effect change of an MR element according to the present invention.

The magnetization directions of the two ferromagnetic layers 30 and 50 in the initial magnetization state changes in a scissor-like action like a pair of scissors cuts paper when these layers detect a signal magnetic a signal magnetic field applied from a medium, resulting in a change in resistance values. In other words, as shown in FIG. 4, the magnetization direction 131 of the first ferromagnetic layer 30 and the magnetization direction 151 of the second ferromagnetic layer 50 tend to move in the same direction when these layers detect an external magnetic field D1 applied in the direction toward the element from the ABS. As a result, the resistance of the element decreases.

Figure 5:
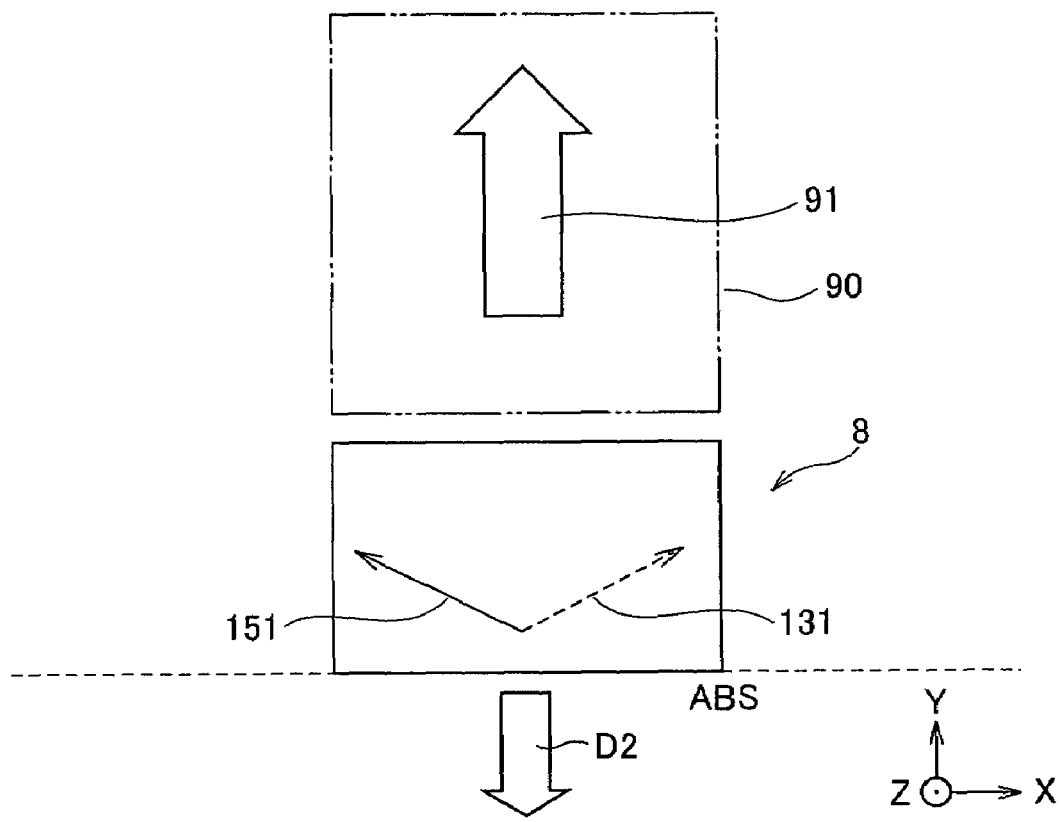
FIG. 5 is a plan view taken by the X-Y plane as seen from above in FIG. 1, which is a model diagram showing the state change of magnetization in response to an external magnetic field that shows the MR effect change of an MR element according to the present invention.

On the other hand, as shown in FIG. 5, the magnetization direction 131 of the first ferromagnetic layer 30 and the magnetization direction 151 of the second ferromagnetic layer 50 tend to move in the opposite direction when these layers detect an external magnetic field D2 applied in the direction away from the ABS. As a result, the resistance of the element increases.

Thus, an external magnetic field can be detected by measuring a series of resistance changes in response to the external magnetic field.

The appropriate orthogonalization of the initial magnetization directions 131 and 151 as shown in FIG. 3 can be achieved by adjusting the magnetization intensity of the orthogonalizing bias function part 90, adjusting the changeability of the magnetization directions of the ferromagnetic layers 30 and 50 that function as free layers, or the like.

The magnetization direction of the orthogonalizing bias function part 90 may be the "ABS out magnetization," which is an inversion of the magnetization direction by 180 degrees, instead of the above-mentioned "ABS in magnetization." In other words, the orthogonalizing bias function part 90 may be magnetized in the Y direction from the back area side toward ABS that is the medium-opposed surface.

[Methods for Forming the Antiparallel State in which the Magnetization Directions 131 and 151 of the Magnetic Layers 30 and 50, Respectively, are Opposite Each Other]

The following explains some methods for making the magnetization directions of two free layers 30 and 50 antiparallel to each other in the track width direction before the orthogonalizing bias function part 90 starts functioning (i.e., before a bias is applied) as shown in FIG. 1 and FIG. 2.

First Mode

In the first mode, a first ferromagnetic layer 30 and a second ferromagnetic layer 50 are exchange-coupled via a nonmagnetic middle layer 40 in such a way that the magnetization of the first ferromagnetic layer 30 and the second ferromagnetic layer 50 are antiparallel to each other before a bias magnetic field is applied from the orthogonalizing bias function part 90.

Figure 6:
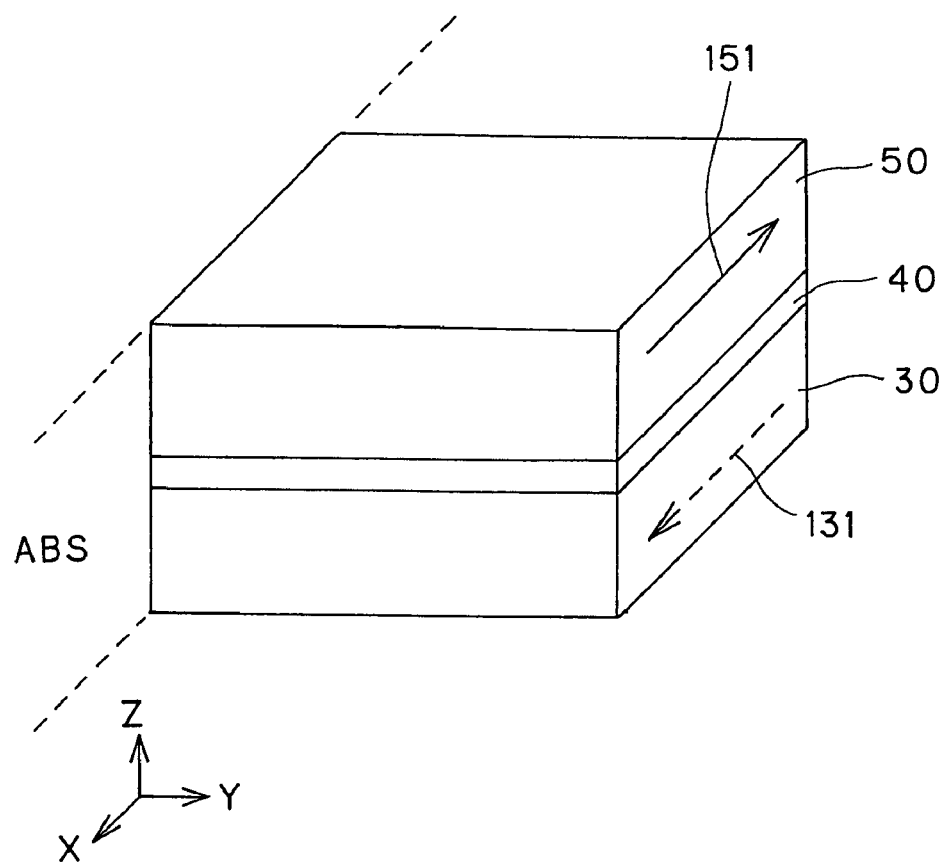
FIG. 6 is a perspective view showing the state in which a first ferromagnetic layer and a second ferromagnetic layer are exchange-coupled via a nonmagnetic middle layer in such a way that their magnetization directions are antiparallel to each other.

In this state, as shown in FIG. 6, for example, the magnetization direction 131 of the first ferromagnetic layer 30 and the magnetization direction 151 of the second ferromagnetic layer 50 are exchange-coupled via the nonmagnetic middle layer 40 to become antiparallel to each other.

Material used for the first ferromagnetic layer 30 and the second ferromagnetic layer 50 includes NiFe, CoFe, CoFeB, CoFeNi, $Co_2MnSi$, $Co_2MnGe$, $FeO_x$ (Fe oxides) and $CoO_x$ (Co oxides). Each layer is about 0.5~0.8 nm in thickness.

These layers function as free layers whose magnetization directions change under the influence of a magnetic field applied externally.

Material used for the nonmagnetic middle layer 40 includes Ru, Ir, Rh, Cr, Cu, Zn, Ga, ZnO, InO, SuO, GaN and ITO (indium tin oxide).

The thickness is about 0.5~5 nm. In order to antiferromagnetically couple the two ferromagnetic layers 30 and 50 (free layers), there are some limitations on the material used for the nonmagnetic middle layer 40 and the setup of its film thickness.

Second Mode

Figure 7:
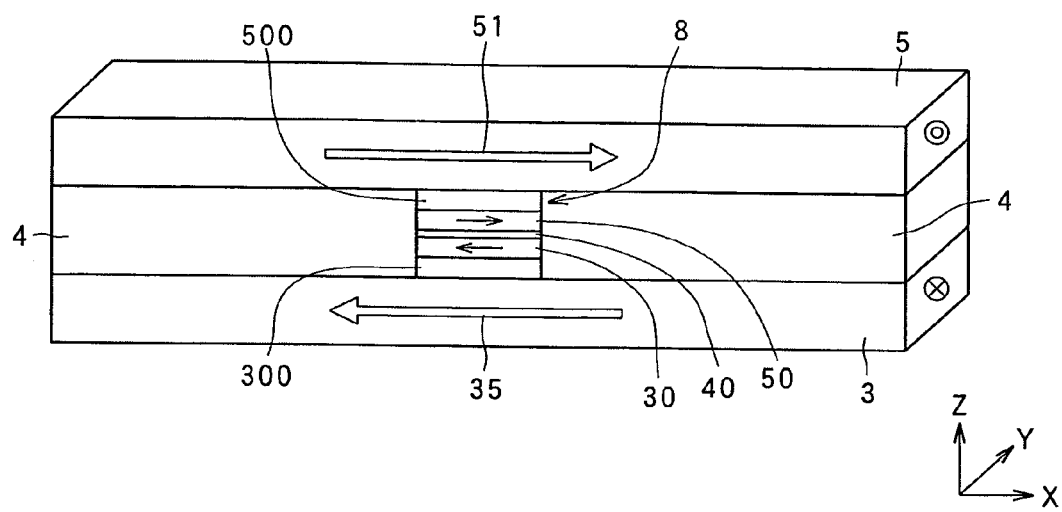
FIG. 7 is a perspective view as seen from the ABS (Air Bearing Surface) of an MR element.

As shown in FIG. 7, an MR element has an MR effect part 8, a first shield layer 3 (also referred to as a lower shield layer 3) and a second shield layer 5 (also referred to as an upper shield layer 5), wherein the MR effect part 8 is substantially vertically sandwiched between both shield layers. Also, the MR element has a CPP structure, wherein a sense current is applied in the laminating direction of the MR effect part 8.

Each magnetization direction of the first shield layer 3 and the second shield layer 5 is controlled by a magnetization direction control means. In the embodiment as shown in FIG. 7, the magnetization 35 of the first shield layer 3 is pinned in the minus width direction (−X direction) from right to left in the drawing. On the other hand, the magnetization 51 of the second shield layer 5 is pinned in the plus width direction (+X direction) from left to right in the drawing. Each of the first shield layer 3 and the second shield layer 5 is preferably controlled by a magnetization direction control means to have a single domain.

The MR effect part 8 has a nonmagnetic middle layer 40, a first ferromagnetic layer 30 and a second ferromagnetic layer 50, wherein the first and second ferromagnetic layers are laminated in a manner of sandwiching the nonmagnetic middle layer 40. A laminated body of the first ferromagnetic layer 30, the nonmagnetic middle layer 40 and the second ferromagnetic layer 50 structures a sensor area. The total thickness of the laminated body is about 10~20 nm.

Each of the first ferromagnetic layer 30 and the second ferromagnetic layer 50 functions as a free layer whose magnetization direction changes in response to an external magnetic field.

The first ferromagnetic layer 30 and the second ferromagnetic layer 50 are influenced by some action to form the antiparallel magnetization state in which their magnetization directions are opposite under the influence of the magnetic action of the first shield layer 3 and the second shield layer 5, respectively. Here, the expression "influenced by some action to form the antiparallel magnetization state" is used because, in a commercially used MR element, the magnetization directions of the first ferromagnetic layer 30 and the second ferromagnetic layer 50 are substantially orthogonalized by a bias magnetic field applied from the orthogonalizing bias function part 90.

In order to realize the above-mentioned antiparallel magnetization state, a first exchange-coupling function gap layer 300 is placed between the first shield layer 3 and the first ferromagnetic layer 30, and a second exchange-coupling function gap layer 500 is placed between the second shield layer 5 and the second ferromagnetic layer 50. In other words, the first ferromagnetic layer 30 is magnetically coupled indirectly via the first shield layer 3 whose magnetization direction is controlled and the first exchange-coupling function gap layer 300. The second ferromagnetic layer 50 is magnetically coupled indirectly via the second shield layer 5 whose magnetization direction is controlled and the second exchange-coupling function gap layer 500.

Figure 8:
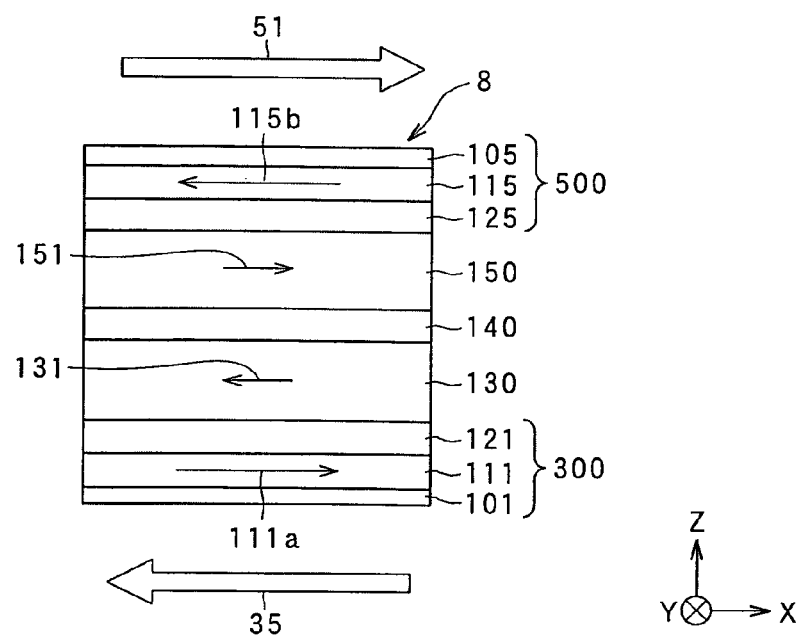
FIG. 8 is a schematic view showing the MR effect part containing the sensor area of an MR element on an enlarged scale.

A description of one embodiment of the constitution of the first exchange-coupling function gap layer 300 is given below by referring to FIG. 8. However, the present invention is not limited to the below-mentioned constitution.

The first exchange-coupling function gap layer 300 is sequentially structured of, from the first shield layer 3 side, an exchange-coupling transmitting layer 101, a gap adjustment layer 111 and an exchange-coupling adjustment layer 121. The gap adjustment layer 111 is a so-called ferromagnetic layer structured of a ferromagnetic body.

The exchange-coupling transmitting layer 101 is structured of at least one material selected from the group consisting of Ru, Rh, Ir, Cr, Cu, Ag, Au, Pt and Pd and allows adjusting the magnetic coupling strength of the magnetization 35 of the first shield layer 3 and the magnetization 111a of the gap adjustment layer 111 by setting the properties and thickness of each material selected. Moreover, the setting of properties and thickness of each material selected allows deciding the magnetization 111a of the gap adjustment layer 111 that is magnetically coupled with the magnetization 35 of the first shield layer 3. In other words, it is decided to be either antiferromagnetic coupling where layers are magnetically coupled having magnetization in the direction opposite to each other or ferromagnetic coupling where layers are magnetically coupled having magnetization in the same direction.

The exchange-coupling adjustment layer 121 is structured of at least one material selected from the group consisting of Ru, Rh, Ir, Cr, Cu, Ag, Au, Pt and Pd and allows adjusting the magnetic coupling strength of the magnetization 111a of the gap adjustment layer 111 and the magnetization 131 of the first ferromagnetic layer 130 by setting the properties and thickness of each material selected. Moreover, the setting of properties and thickness of each material selected allows determining the direction of the magnetization 131 of the first ferromagnetic layer 130 that is magnetically coupled with the magnetization 111a of the gap adjustment layer 111. In other words, it is determined to be either antiferromagnetic coupling or ferromagnetic coupling.

The thickness of the first exchange-coupling function gap layer 300 is set to about 1.5~6.0 nm.

Similarly, a description of one embodiment of the constitution of the second exchange-coupling function gap layer 500 is given below by referring to FIG. 8. However, the present invention is not limited to the below-mentioned constitution.

The second exchange-coupling function gap layer 500 is structured of sequentially, from the second shield layer 5 side, an exchange-coupling transmitting layer 105, a gap adjustment layer 115 and an exchange-coupling adjustment layer 125. The gap adjustment layer 115 is a so-called ferromagnetic layer structured of a ferromagnetic body.

The exchange-coupling transmitting layer 105 is structured of at least one material selected from the group consisting of Ru, Rh, Ir, Cr, Cu, Ag, Au, Pt and Pd and allows adjusting the magnetic coupling strength of the magnetization 51 of the second shield layer 5 and the magnetization 115b of the gap adjustment layer 115 by setting the properties and thickness of each material selected. Moreover, the setting of properties and thickness of each material selected determination of the magnetization 115b of the gap adjustment layer 115 that is magnetically coupled with the magnetization 51 of the second shield layer 5. In other words, it is decided to be either antiferromagnetic coupling (where layers are magnetically coupled having magnetization in the direction opposite to each other) or ferromagnetic coupling (where layers are magnetically coupled having magnetization in the same direction).

The exchange-coupling adjustment layer 125 is structured of at least one material selected from the group consisting of Ru, Rh, Ir, Cr, Cu, Ag, Au, Pt and Pd and allows adjusting the magnetic coupling strength of the magnetization 115b of the gap adjustment layer 115 and the magnetization 151 of the second ferromagnetic layer 150 by setting the properties and thickness of each material selected. Moreover, the setting of properties and thickness of each material selected determination of the direction of the magnetization 151 of the second ferromagnetic layer 150 that is magnetically coupled with the magnetization 115b of the gap adjustment layer 115. In other words, it is determined to be either antiferromagnetic coupling or ferromagnetic coupling.

The thickness of the second exchange-coupling function gap layer 500 is set to about 1.5~6.0 nm.

The reference numeral 4 in the drawing shows insulating layers.

Third Mode

The third mode is the further development of the constitution of the first shield layer 3 and the second shield layer 5 in the above-mentioned second mode, as shown in FIG. 9.

As shown in FIG. 9, each of the first shield layer 3 disposed on the down side of the MR effect part 8 and the second shield layer 5 disposed on the up side thereof is formed as a framework on the plane defined by the width and length directions of the element (X-Y plane).

The frameworks of the first shield layer and the second shield layer have front frame constitution parts 31 and 51 disposed at the front (i.e., on the ABS side) in the vicinity of the MR effect part and side frame constitution parts 35 and 55 disposed on the side position from the end part of each front frame constitution part toward the posterior side, respectively.

Figure 10:
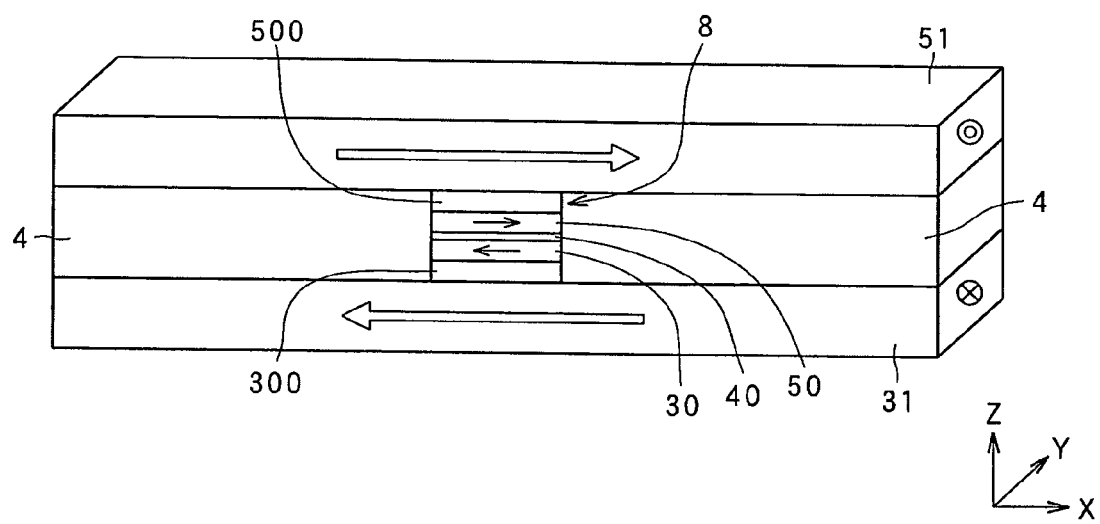
FIG. 10 is a perspective view showing the periphery of the front frame constitution part where the MR effect part is disposed on the ABS side in FIG. 9.

As shown in FIG. 10, the first ferromagnetic layer 30 and second ferromagnetic layer 50 constituting the MR effect part 8 are respectively structured so that the antiparallel magnetization state in which their magnetization directions are opposite are realized under an influence of the magnetic action of the front frame constitution part 31 of the first shield layer 3 and the front frame constitution part 51 of the second shield layer 5.

As shown in FIG. 9, part of the side frame constitution part 35 of the first shield layer 3 has a combined body of a first nonmagnetic gap layer 153 and a first bias magnetic field application layer 154. The first nonmagnetic gap layer 153 is designed and disposed in such a way as to efficiently transmit magnetic flux 154a generated from the first bias magnetic field application layer 154 to the front frame constitution part 31 side of the first shield layer 3. The combined body of the first nonmagnetic gap layer 153 and the first bias magnetic field application layer 154 not only forms a closed magnetic circuit in which magnetic flux can circulate around the framework constituting the first shield layer 3 but also is structured so that the magnetization of the front frame constitution part 31 of the first shield layer has a single domain as well as controls the magnetization direction.

Similarly, part of the side frame constitution part 55 of the second shield layer has a combined body of a second nonmagnetic gap layer 155 and a second bias magnetic field application layer 156. The second nonmagnetic gap layer 155 is designed and disposed to efficiently transmit magnetic flux 156a generated from the second bias magnetic field application layer 156 to the front frame constitution part 51 side of the second shield layer 5. The combined body of the second nonmagnetic gap layer 155 and the second bias magnetic field application layer 156 not only forms a closed magnetic circuit in which magnetic flux can circulate around the framework constituting the second shield layer 5 but also is structured to make the magnetization of the front frame constitution part 51 of the second shield layer 5 have a single magnetic domain as well as control the magnetization direction.

The constitution of the MR effect part 8 is the same as that in the second mode.

As shown in FIG. 10, the first ferromagnetic layer 30 constituting the MR effect part 8 is magnetically coupled with the first shield layer 3 whose magnetization direction is controlled indirectly via a first exchange-coupling function gap layer 300.

The second ferromagnetic layer 50 constituting the MR effect part 8 is magnetically coupled with the second shield layer 5 whose magnetization direction is controlled indirectly via a second exchange-coupling function gap layer 500.

The constitution of the first exchange-coupling function gap layer 300 and the second exchange-coupling function gap layer 500 may be similar to that of the first exchange-coupling function gap layer 300 and the second exchange-coupling function gap layer 300 in the above-mentioned second mode.

Fourth Mode

Figure 11:
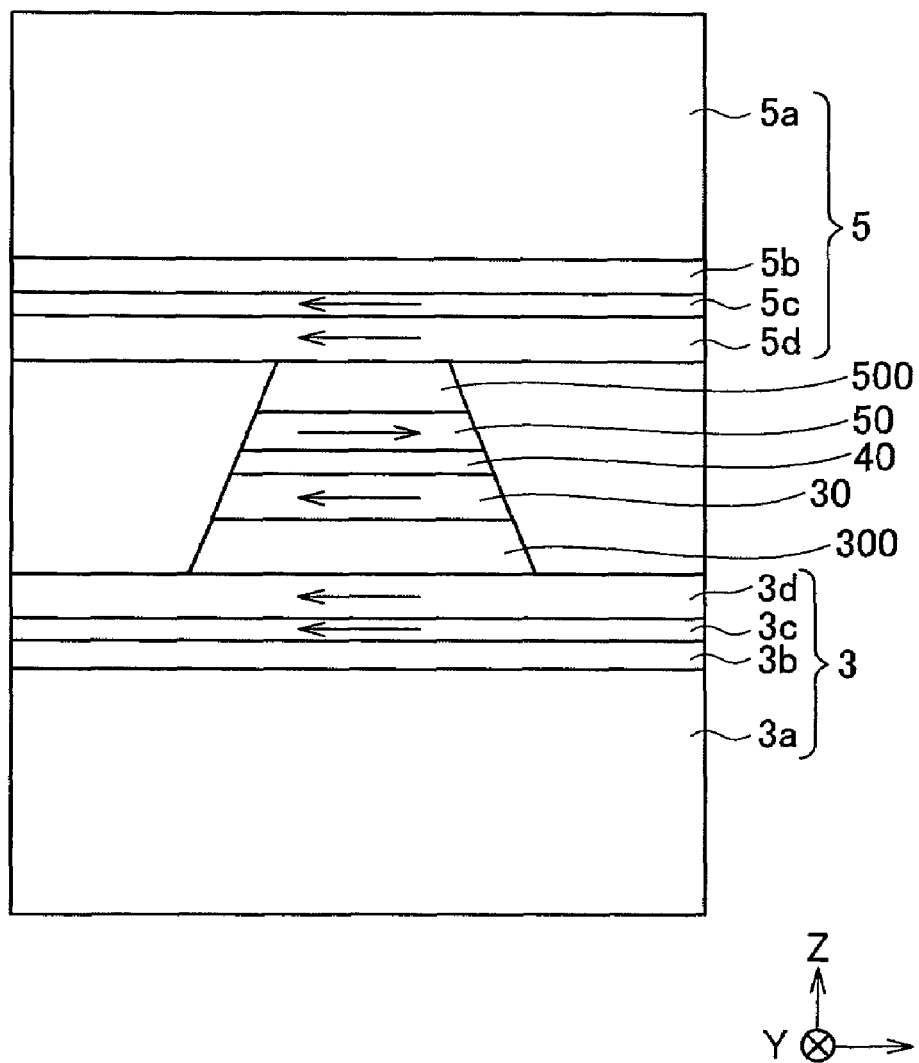
FIG. 11 is diagram as seen from the ABS side explaining an element structured in a manner of using the magnetization of part of a shield layer controlled by pinning by an antiferromagnetic layer in order to make the magnetization directions of a first ferromagnetic layer and a second ferromagnetic layer, both of which function as a free layer, antiparallel to each other.

In order to make the magnetization directions of the first ferromagnetic layer 30 and the second ferromagnetic layer 50, both of which function as free layers, antiparallel to each other, the fourth mode uses the magnetization of part of a shield layer that is controlled by pinning an antiferromagnetic layer as shown in FIG. 11.

In other words, as shown in FIG. 11, a first shield layer 3 has a laminated structure of sequentially, from the lower side, a main shield layer (3a) made of NiFe having a thickness of 1000~2000 nm, an antiferromagnetic layer (3b) made of IrMn having a thickness of 6 nm and a magnetic field application layer formed of a combined laminated body of a CoFe layer (3c) having a thickness of 1.5 nm and a NiFe layer (3d) having a thickness of 20 nm. A second shield layer 5 has a laminated structure of sequentially, from the upper side, a main shield layer (5a) made of NiFe having a thickness of 1000~2000 nm, an antiferromagnetic layer (5b) made of IrMn having a thickness of 6 nm and a magnetic field application layer formed of a combined laminated body of a CoFe layer (5c) having a thickness of 1.5 nm and a NiFe layer (5d) having a thickness of 20 nm.

The first shield layer 3 and the second shield layer 5 having such structures are structured in a manner of sandwiching an MR effect part 8 via a first exchange-coupling function gap layer 300 and a second exchange-coupling function gap layer 500 in order to make the magnetization directions of a first ferromagnetic layer 30 and a second ferromagnetic layer 50, both of which function as free layers, antiparallel to each other.

The above-mentioned MR element, an examination object, is generally used as a sensor for reading the magnetic information of a thin film magnetic head after the wafer processing. A description of the overall structure of a thin film magnetic head containing an MR element is briefly given below.

[Explanation of the Overall Structure of a Thin Film Magnetic Head]

Figure 32:
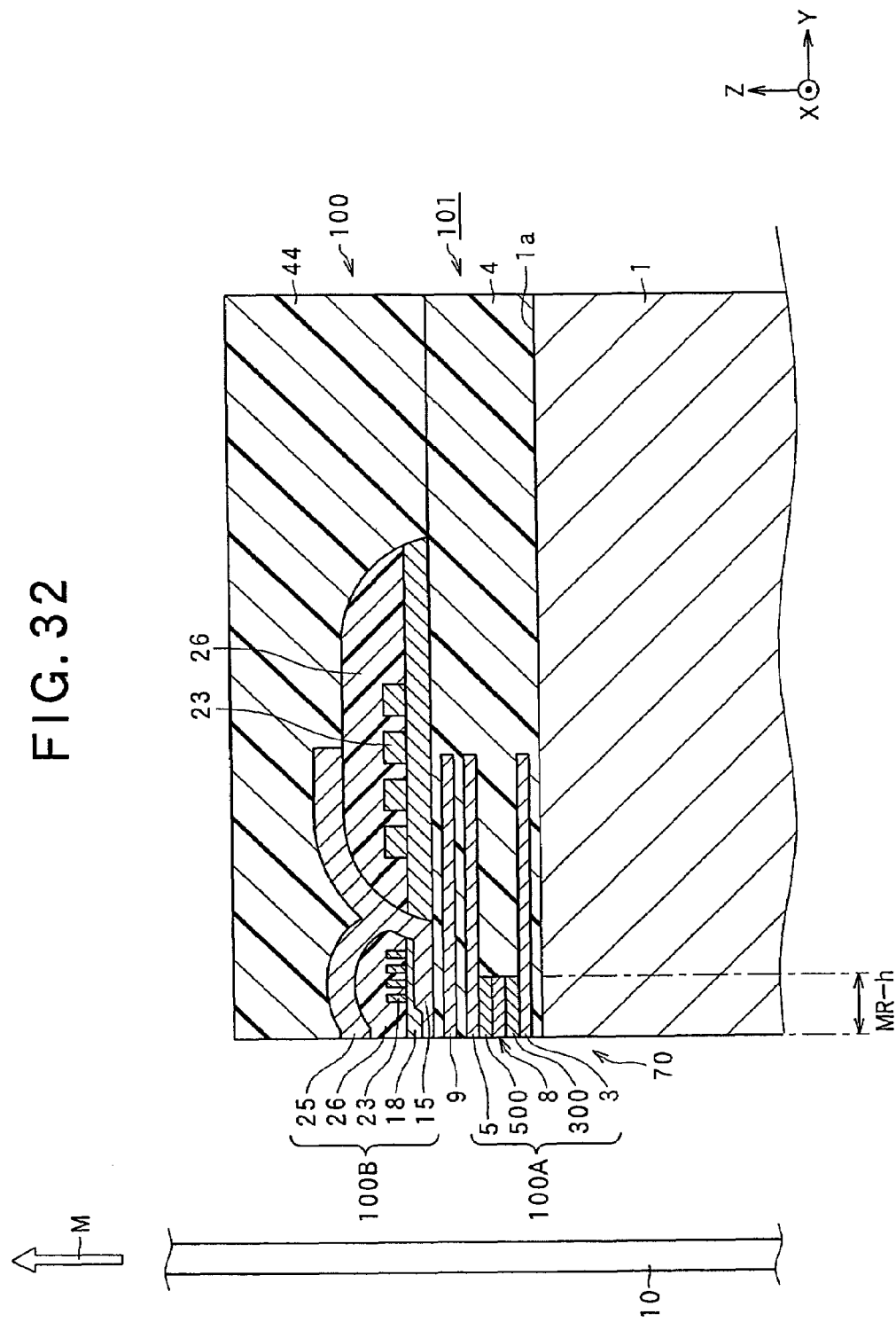
FIG. 32 is a sectional view of a thin film magnetic head in parallel with the so-called air bearing surface (ABS).

FIG. 32 shows a sectional view (i.e., a cross section taken by the Y-Z plane) of a thin film magnetic head in parallel with the so-called air bearing surface (ABS).

A thin film magnetic head 100 as shown in FIG. 32 is mounted on a magnetic recording device such as a hard disk drive in order to magnetically process a recording medium 10 such as a hard disk that moves in the medium traveling direction M.

The thin film magnetic head 100 as exemplified in the drawing is a so-called complex type head that is executable for both recording processing and reproducing processing as magnetic processing. As shown in FIG. 32, it has a structure of a magnetic head part 101 formed on a slider substrate 1 structured of ceramic material such as AlTic (Al₂O₃.TiC).

A magnetic head part 101 has a laminated constitution of a reproducing head part 100A for reproducing magnetic information recorded using the MR effect and, for example, a shield type recording head part 100B for executing the recording processing of the perpendicular recording system.

A description is given below in more detail.

A first shield layer 3 and a second shield layer 5 are flat layers formed in a manner of being substantially parallel to the side surface 1a of the slider substrate 1. These layers 3 and 5 form part of ABS 70 that is the medium-opposed surface.

An MR effect part 8 is disposed in a manner of being sandwiched between the first shield layer 3 and the second shield layer 5 and forms part of the ABS 70. A height perpendicular to the ABS 70 (i.e., in the Y direction) is an MR height (MR-h).

The first shield layer 3 and the second shield layer 5 are formed by a pattern plating method including a frame plating method, for example. Although it is not clearly shown in the drawing, the first shield layer 3 and the second shield layer 5 need to be structured in such a way as to demonstrate the above-mentioned effect of the present invention.

The MR effect part 8 is a laminated layer substantially parallel to the side surface 1a of the slider substrate 1, and forms a part of the ABS 70.

The MR effect part 8 is a film surface perpendicular type (CPP) laminated film in which a sense current flows in the direction perpendicular to the laminating surface and has a constitution as described above.

Moreover, as shown in FIG. 32, an intra-element shield layer 9 made of the same material as that of the second shield layer 5 is formed between the second shield layer 5 and the recording head part 100B.

The intra-element layer 9 functions in a manner of shielding the MR element 8 that functions as a sensor from a magnetic field generated by the recording head part 100B, thereby blocking exogenous noises at the time of reading. A bucking coil part may also be formed between the intra-element layer 9 and the recording head part 100B. The bucking coil part is to generate magnetic flux that overrides a magnetic flux loop that is generated by the recording head part 100B and passes through the upper and lower electrode layers of the MR element 8 and, therefore, acts in a manner of suppressing unnecessary writing to a magnetic disk or wide area adjacent tracks erasing (WATE) phenomena that are erasing operations.

Insulating layers 4 and 44 made of alumina, etc. are formed in the gap between the first shield layer 3 and the second shield layer 5 on the side opposite to the ABS of the MR element 8; in the posterior region between the first and second shield layers 3 and 5 and the intra-element shield layer 9 on the side opposite to the ABS 70; in the gap between the first shield layer 3 and the slider substrate 1; and in the gap between the intra-element shield layer 9 and the recording head part 100B.

The recording head part 100B is preferably structured for perpendicular magnetic recording and, as shown in FIG. 32, has a main magnetic pole layer 15, a gap layer 18, a coil insulating layer 26, a coil layer 23 and an auxiliary magnetic pole layer 25.

The main magnetic pole layer 15 is structured to be a leading magnetic path for leading and focusing magnetic flux initiated by the coil layer 23 to the recording layer of a magnetic recording medium 10 to be written. It is preferred that the end part of the main magnetic pole layer 15 on the side of the ABS 70 should be smaller in thickness compared with other portions in the track width direction (i.e., the direction along the X-axis in FIG. 32) and in the laminating direction (i.e., the direction along the Z-axis in FIG. 32). As a result, it is possible to generate a magnetic field for minute and strong writing corresponding to high recording density.

On the end part of the auxiliary magnetic pole layer 25 magnetically coupled with the main magnetic pole layer 15 on the side of the ABS 70 is formed a trailing shield part that has a wider layer cross section than the other portions of the auxiliary magnetic layer 25. As shown in FIG. 32, the auxiliary magnetic pole layer 25 is disposed in a manner of being opposed to the end part of the main magnetic pole layer 15 on the side of the ABS 70 via the gap layer made of insulating material such as alumina and the coil insulating layer 26.

The provision of the auxiliary magnetic pole layer 25 allows making the magnetic field gradient steep between the auxiliary magnetic pole layer 25 and the main magnetic pole layer 15 in the vicinity of the ABS 70. As a result, jitter is reduced in a signal output, thereby making the error rate smaller at the time of reading.

The auxiliary magnetic pole layer 25 is formed for example, to about 0.5~5 μm in thickness by a frame plating method, a sputtering method or the like. Employed material may be an alloy made of two or three selected from the group consisting of Ni, Fe and Co, for example, or an alloy made of these elements, as main components, added with predetermined chemical elements.

The gap layer 18 is formed to separate the coil layer 23 from the main magnetic pole layer 15. The gap layer 18 may be formed by a sputtering method, a CVD method or the like, for example, have a thickness of about 0.01~0.5 μm and be structured of Al₂O₃, diamond-like carbon (DLC) or the like.

[Explanation of an Examination Method for an MR Element that is the Main Part of the Present Invention]

The element examination method according to the present invention is performed for an MR element used in the above-mentioned thin film magnetic head.

As shown in FIG. 12, the examination method according to the present invention is to examine whether or not the magnetization direction 131 of the first ferromagnetic layer 30 that functions as a free layer and the magnetization direction 151 of the second ferromagnetic layer 50 that functions as a free layer are antiparallel to each other in the track width direction (i.e., the X direction) before the orthogonalizing bias function part 90 starts functioning.

The magnetization directions 131 and 151 of the first ferromagnetic layer 30 and the second ferromagnetic layer 50 as shown in FIG. 12, respectively, are antiparallel to each other in the track width direction (i.e., in the X direction), showing a well structured element.

Figure 13:
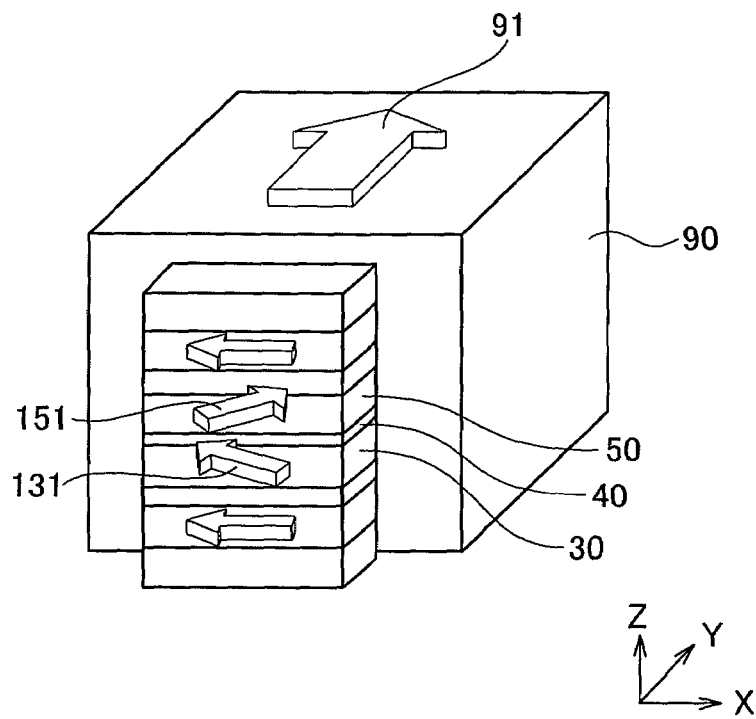
FIG. 13 is a perspective view related to FIG. 12 showing a first magnetization forming mode, wherein the magnetization direction of the orthogonalizing bias function part is from the anterior side of an element (i.e., ABS side) to the posterior side thereof.

As a specific method, a first magnetization forming mode (ABS in magnetization) is first carried out, as shown in FIG. 13, in which the magnetization direction of the orthogonalizing bias function part 90 is from the anterior side of the element (i.e., ABS side) to the posterior side thereof (i.e., +Y direction as shown by the reference numeral 91).

The orthogonalizing bias function part 90 is structured of a hard magnet (e.g., CoPt) or a laminated body of an antiferromagnetic layer and a ferromagnetic layer (e.g., IrMn/CoFe) and is magnetized by the magnetization operation or the annealing processing in a magnetic field.

Figure 14:
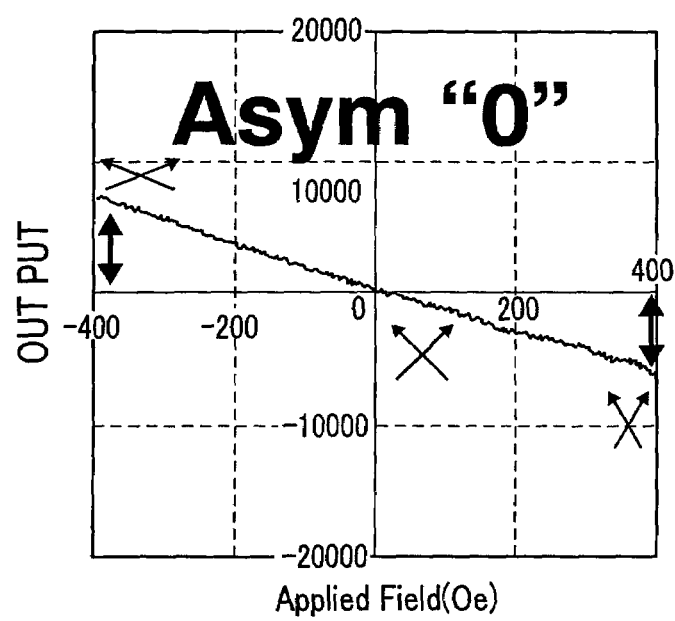
FIG. 14 is a graph given by measuring the output waveform of an element in response to an external magnetic field in the state of the first magnetization forming mode as shown in FIG. 13.

The graph as shown in FIG. 14 is given by measuring the output waveform of the element in response to an external magnetic field in the first magnetization forming mode as shown in FIG. 13. Based on this graph, the asymmetry of the output waveform is checked. As a result, it is judged that the waveform is symmetric, and therefore asymmetry is zero (Asymmetry=0).

Figure 15:
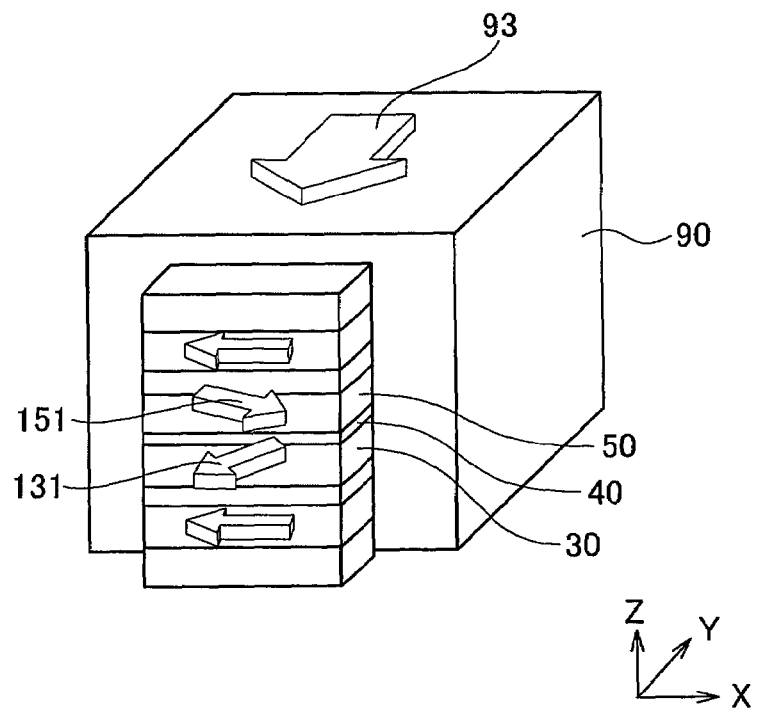
FIG. 15 is a perspective view related to FIG. 12 showing a second magnetization forming mode, wherein the magnetization direction of the orthogonalizing bias function part is from the posterior side of an element to the anterior side thereof (i.e., ABS side).

Next, as shown in FIG. 15, a second magnetization forming mode (ABS out magnetization) is carried out in which the magnetization direction of the orthogonalizing bias function part 90 is from the posterior side of the element to the anterior side thereof (i.e., —Y direction as shown by the reference numeral 93).

Figure 16:
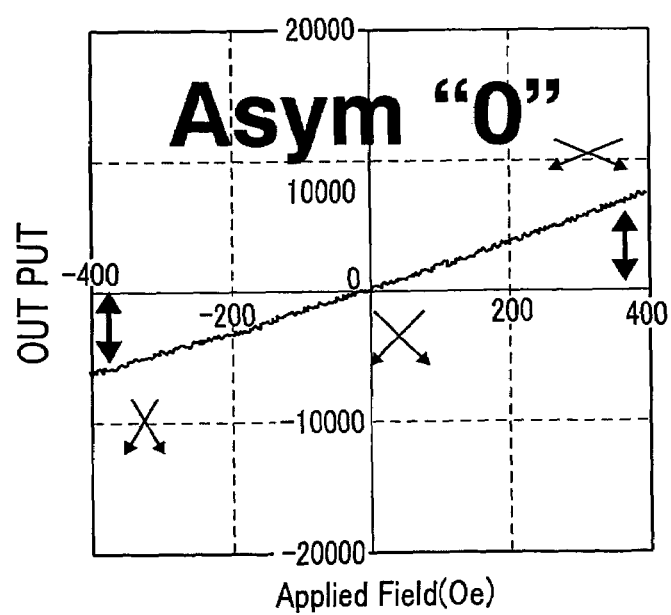
FIG. 16 is a graph given by measuring the output waveform of an element in response to an external magnetic field in the state of the second magnetization forming mode as shown in FIG. 15.

The graph as shown in FIG. 16 is given by measuring the output waveform of the element in response to an external magnetic field in the second magnetization forming mode. Based on this graph, the asymmetry of the output waveform is checked. As a result, it is judged that the waveform is symmetric, and therefore asymmetry is zero (Asymmetry=0).

In the present invention, it is necessary to be judged that asymmetry is zero (Asymmetry=0) in both the above-mentioned first magnetization forming mode and the second magnetization forming mode. This is because it may be judged that asymmetry is zero (Asymmetry=0) by accident as a result of canceling out failures if only either one of the first magnetization forming mode and the second magnetization forming mode is judged to be symmetrical.

The judging standards of zero asymmetry (Asymmetry=0) may be decided in view of actual production yields, etc. The most important points in the present invention consist in reversing the magnetization of a bias between the first magnetization forming mode and the second magnetization forming mode, measuring the output waveform of an element in response to an external magnetic field for each magnetization forming mode and then checking the asymmetry of these output waveforms.

As for checking the asymmetry of output waveforms, it is desirable to set and add to the judging standards an absolute value of the difference of asymmetry between the first magnetization forming mode and the second magnetization forming mode. The absolute value of the difference of asymmetry is preferably not greater than 20%.

Instead of or in addition to the above-mentioned checking of the asymmetry of output waveforms, it might also be a good idea to examine whether or not the magnetization directions of the first ferromagnetic layer and the second ferromagnetic layer, both of which function as free layers, are antiparallel to each other in the track width direction before the above-mentioned orthogonalizing bias function part starts functioning by drawing both graphs of output waveforms as shown in FIG. 14 and FIG. 16 at the same time, integrating them and then judging whether or not the integrated graph is symmetric (i.e., whether or not there is a mirror-image relationship) using as reference the longitudinal axis where the applied magnetic field is zero. When both graphs of output waveforms as shown in FIG. 14 and FIG. 16 are drawn at the same time and integrated, the integrated graph shows the symmetric relationship using as reference the longitudinal axis where the applied magnetic field is zero. There is a mirror-image relationship using as reference the longitudinal axis where the applied magnetic field is zero.

Moreover, in the present invention, the first magnetization forming mode is "ABS in magnetization" and the second magnetization forming mode "ABS out magnetization" as a matter of convenience. There occurs no problem if the first magnetization forming mode is "ABS out magnetization" and the second magnetization forming mode "ABS in magnetization." This is because no change occurs in the idea of the present invention by reversing them.

Examination of a Defective Element

Next, the element examination method according to the present invention will be explained where an element to be examined is defective, i.e., where the magnetization directions 131 and 151 of the first ferromagnetic layer 30 that functions as a free layer and the second ferromagnetic layer 50 that functions as a free layer, respectively, are not antiparallel to each other in the track width direction by referring to FIG. 17~FIG. 21.

Figure 17:
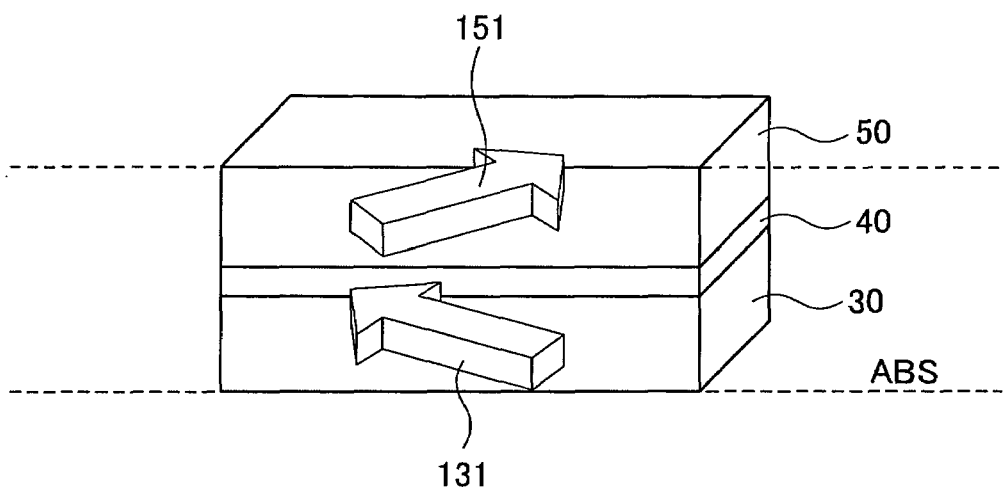
FIG. 17 is a perspective view showing the state of a defective element in which the magnetization directions of a first ferromagnetic layer and a second ferromagnetic layer are not antiparallel to each other in the track width direction.

As shown in FIG. 17, the magnetization directions 131 and 151 of the first ferromagnetic layer 30 and the second ferromagnetic layer 50, both of which function as free layers, respectively, are not antiparallel to each other in the track width direction before the orthogonalizing bias function part starts functioning. Both of the magnetization directions 131 and 151 are slightly directed toward the back area inside the element at a predetermined angle as shown in FIG. 17.

Figure 18:
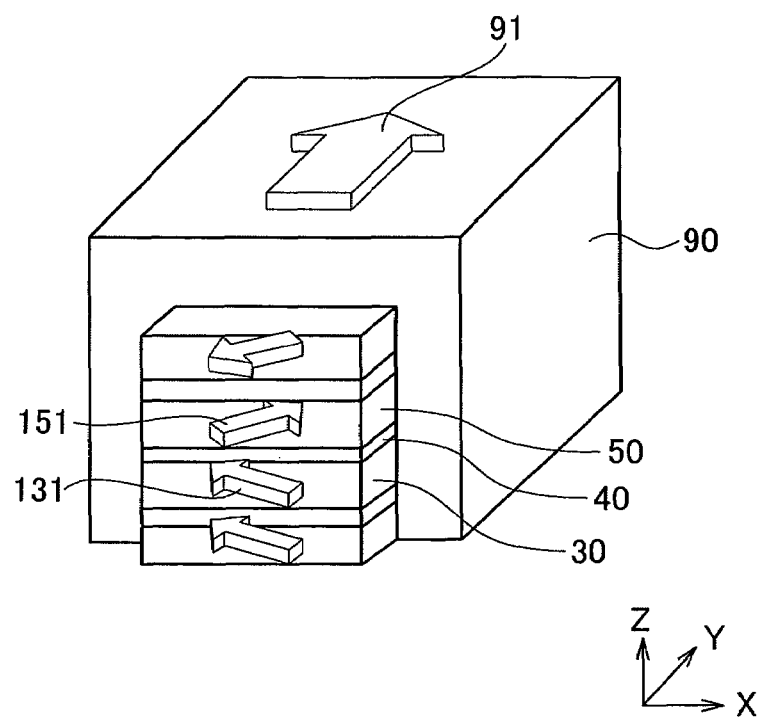
FIG. 18 is a perspective view related to FIG. 17 showing a first magnetization forming mode, wherein the magnetization direction of the orthogonalizing bias function part is from the anterior side of an element (i.e., ABS side) to the posterior side thereof.
Figure 19:
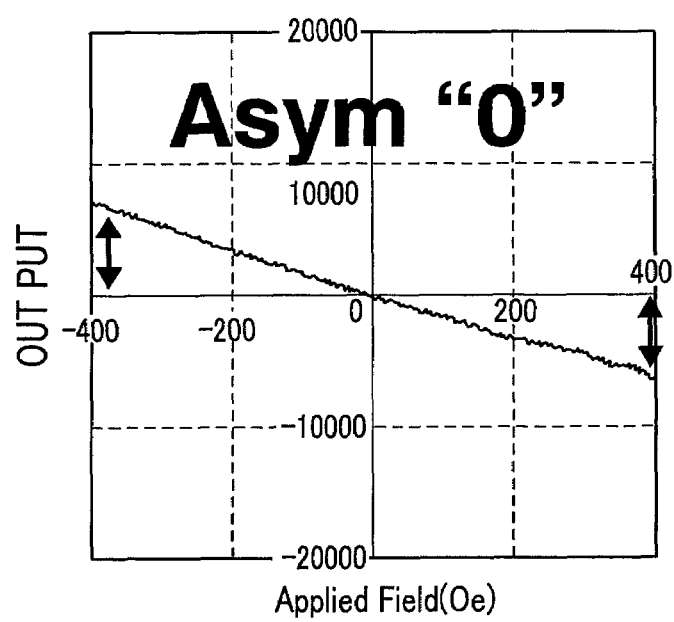
FIG. 19 is a graph given by measuring the output waveform of an element in response to an external magnetic field in the state of the first magnetization forming mode as shown in FIG. 18.
Figure 20:
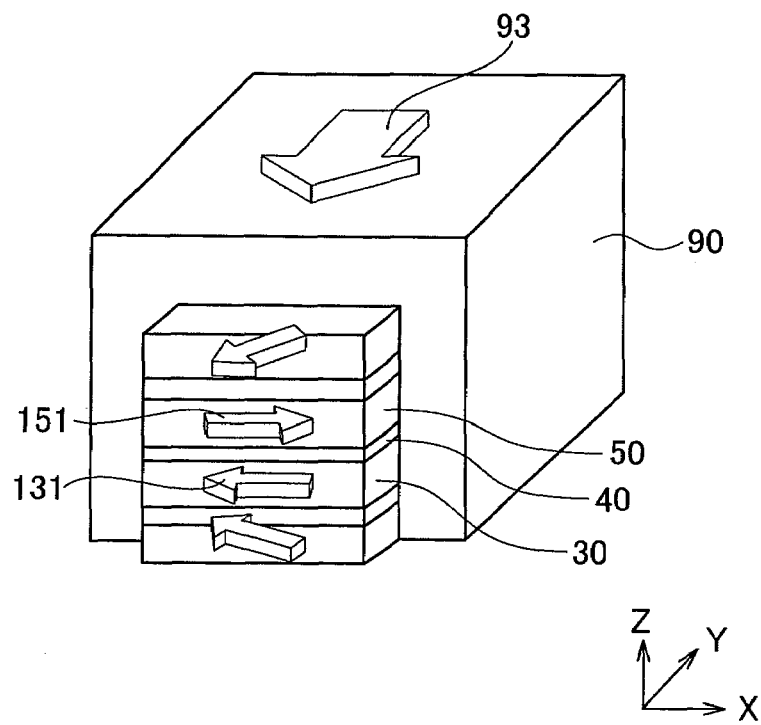
FIG. 20 is a perspective view related to FIG. 17 showing a second magnetization forming mode, wherein the magnetization direction of the orthogonalizing bias function part is from the posterior side of an element to the anterior side thereof (i.e., ABS side).
Figure 21:
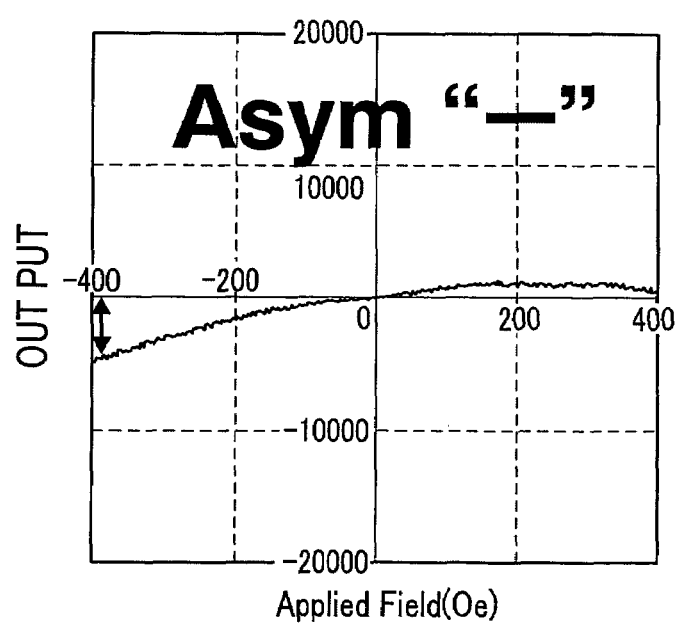
FIG. 21 is a graph given by measuring the output waveform of an element in response to an external magnetic field in the state of the second magnetization forming mode as shown in FIG. 20.

The element examination method according to the present invention is performed for such a defective element. First, as shown in FIG. 18, the first magnetization forming mode (ABS in magnetization) is performed, wherein the magnetization direction of the orthogonalizing bias function part 90 is from the anterior side of the element (i.e., ABS side) to the posterior side thereof (as shown by the reference numeral 91). In the first magnetization forming mode, the output waveform of the element is measured in response to an external magnetic field. As a result, a graph as shown in FIG. 19 is provided. Based on this graph, the asymmetry of the output waveform is checked. The waveform happens to be symmetric, and it is judged that asymmetry is zero (Asymmetry=0). However, a graph as shown in FIG. 21 is obtained when the second magnetization forming mode (ABS out magnetization) is performed as shown in FIG. 20, wherein the magnetization direction of the orthogonalizing bias function part 90 is from the posterior side of the element to the anterior side thereof (as shown by the reference numeral 93) and then, in this second magnetization forming mode, the output waveform of the element is measured in response to an external magnetic field. Based on the graph as shown in FIG. 21, it is judged that there is an asymmetry problem, and the symbol "-" is displayed, showing the problem. As a result, it is judged that the element is defective.

A description of another mode in which an element to be examined is defective is given below by referring to FIG. 22~FIG. 26.

As shown in FIG. 22, the magnetization directions 131 and 151 of the first ferromagnetic layer 30 and the second ferromagnetic layer 50, both of which function as free layers, respectively, are not antiparallel to each other in the track width direction before the orthogonalizing bias function part starts functioning. Both magnetization directions 131 and 151 are slightly directed toward the front side which is the outside of the element at a predetermined angle as shown in FIG. 22.

Figure 23:
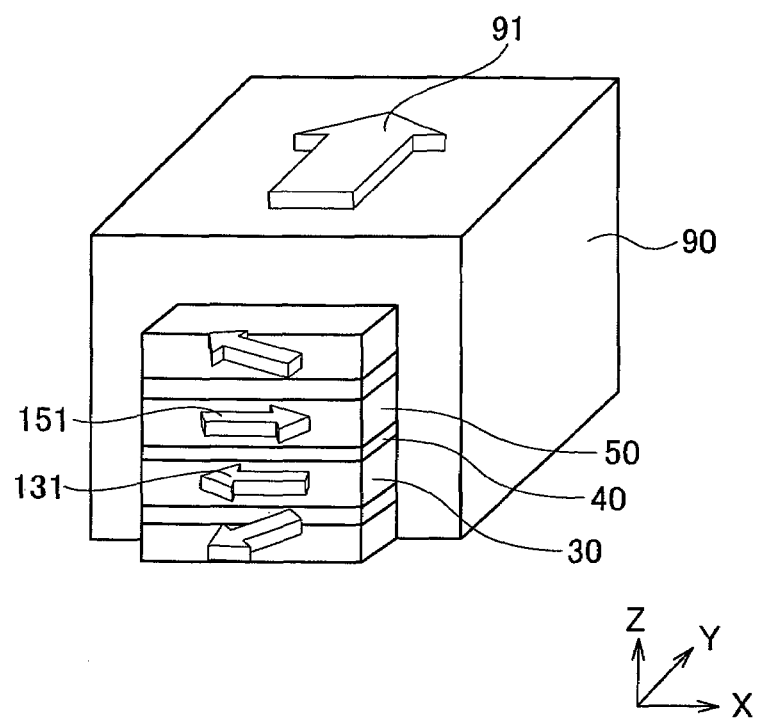
FIG. 23 is a perspective view related to FIG. 22 showing a first magnetization forming mode, wherein the magnetization direction of the orthogonalizing bias function part is from the anterior side of an element (i.e., ABS side) to the posterior side thereof.
Figure 24:
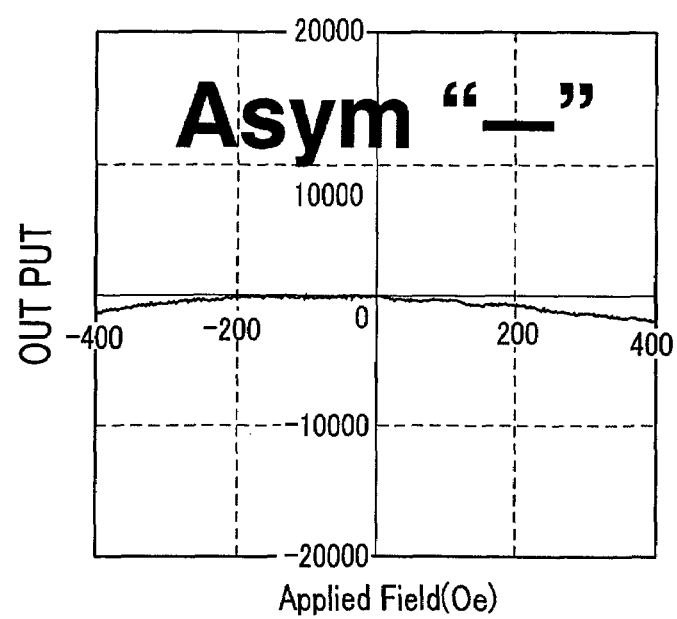
FIG. 24 is a graph given by measuring the output waveform of an element in response to an external magnetic field in the state of the first magnetization forming mode as shown in FIG. 23.
Figure 25:
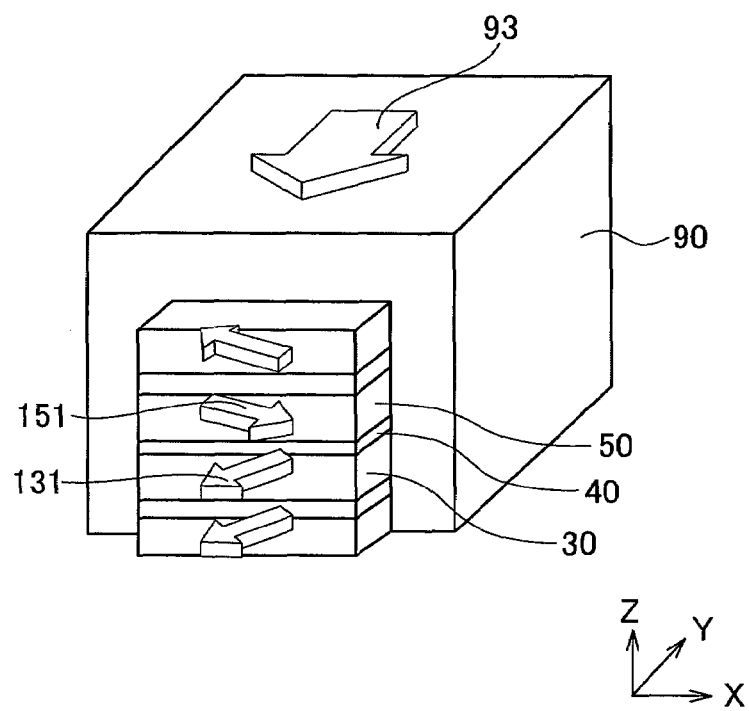
FIG. 25 is a perspective view related to FIG. 22 showing a second magnetization forming mode, wherein the magnetization direction of the orthogonalizing bias function part is from the posterior side of an element to the anterior side thereof (i.e., ABS side).
Figure 26:
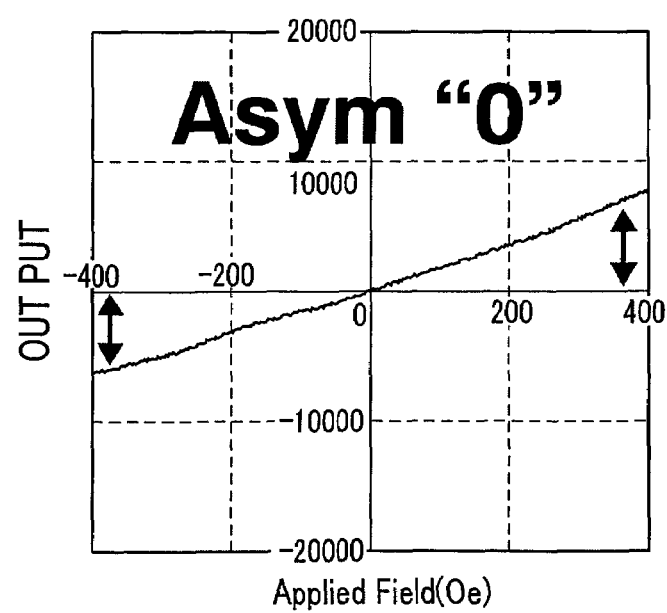
FIG. 26 is a graph given by measuring the output waveform of an element in response to an external magnetic field in the state of the second magnetization forming mode as shown in FIG. 25.

The element examination method according to the present invention is performed for such a defective element. First, as shown in FIG. 23, the first magnetization forming mode (ABS in magnetization) is performed, wherein the magnetization direction of the orthogonalizing bias function part 90 is from the anterior side of the element (i.e., ABS side) to the posterior side thereof (as shown by the reference numeral 91). In the first magnetization forming mode, the output waveform of the element is measured in response to an external magnetic field. As a result, a graph as shown in FIG. 24 is given. Based on this graph, the asymmetry of the output waveform is checked. As a result, it is judged that there is an asymmetry problem, and the symbol "-" is displayed, showing the problem. Next, the second magnetization forming mode (ABS out magnetization) is performed as shown in FIG. 25, wherein the magnetization direction of the orthogonalizing bias function part 90 is from the posterior side of the element to the anterior side thereof (as shown by the reference numeral 93) and then, in the second magnetization forming mode, the output waveform of the element is measured in response to an external magnetic field. As a result, a graph as shown in FIG. 26 is given. Based on the graph as shown in FIG. 26, the waveform happens to be symmetric, and it is judged that asymmetry is zero (Asymmetry=0). Comparison between the graph as shown in FIG. 24 and the graph as shown in FIG. 26 shows that symmetry has not been produced.

Figure 27:
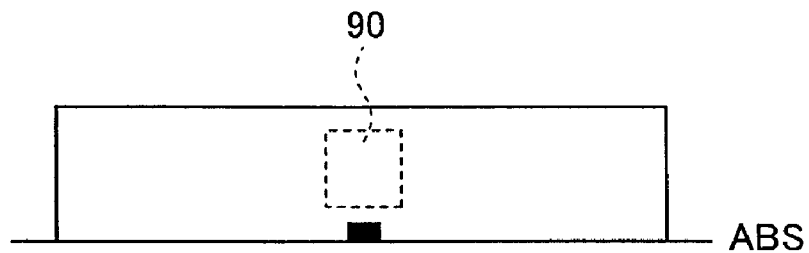
FIG. 27 is a plan view schematically showing the state of an element whose ABS is exposed, wherein an MR height having a predetermined length is formed by lapping the ABS.

The above-mentioned graphs as shown in FIG. 14, FIG. 16, FIG. 19, FIG. 21, FIG. 24 and FIG. 26 are obtained by measuring an element whose ABS is exposed (See FIG. 27). The ABS of an element is exposed, for example, (1) when a group of MR elements disposed and formed on a wafer substrate in the matrix state is cut into multiple bars, and MR elements contained in one bar thus cut is examined, (2) when the element is in the slider state as one element, (3) when the element is in the head gimbal assembly state having a slider containing one MR element and a suspension elastically supporting the slider and what not. When the ABS of an element is exposed, an MR height (MR-h) having a predetermined length is formed by lapping the ABS (See MR-h in FIG. 32.)

Figure 28:
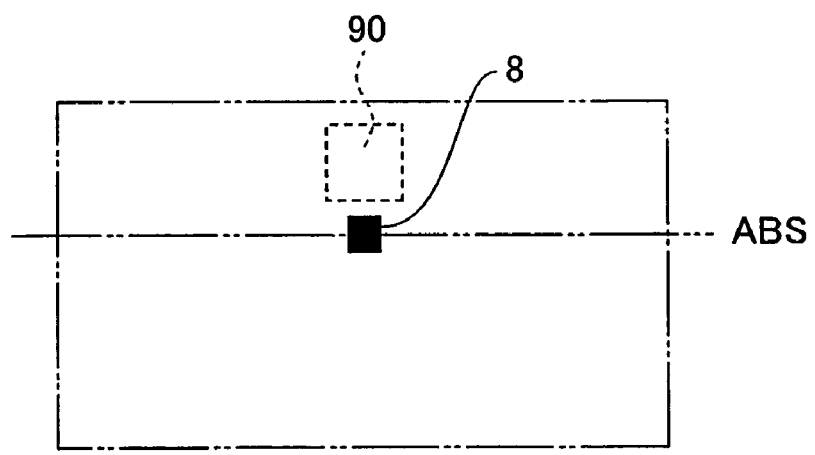
FIG. 28 is a plan view schematically showing the state of an element whose ABS is not exposed in the wafer processing completion state, for example, wherein lapping has not been conducted yet, and therefore the ABS height of the element remains in the original long state.

On the other hand, ABS is not exposed at a time when an examination is conducted in the wafer processing completion state for a group of MR elements disposed and formed on a wafer substrate in the matrix state (See FIG. 28.) In this case, the height of the element is not lapped and, therefore, remains in the initial long state. Moreover, prior to the cutting processing, the shape of shields is different from that of an element whose ABS is exposed. In the wafer processing completion state, a shield absorption area can be observed in a low magnetic field because a magnetic field does not penetrate a sensor.

A description is given below for the examination according to the present invention in the wafer processing completion state, i.e., when ABS is not exposed.

As shown in FIG. 12, a case of when a well structured element in which the magnetization directions 131 and 151 of the first ferromagnetic layer 30 and the second ferromagnetic layer 50, both of which function as free layers, respectively, are antiparallel to each other in the track width direction before the orthogonalizing bias function part starts functioning is discussed below.

Figure 29:
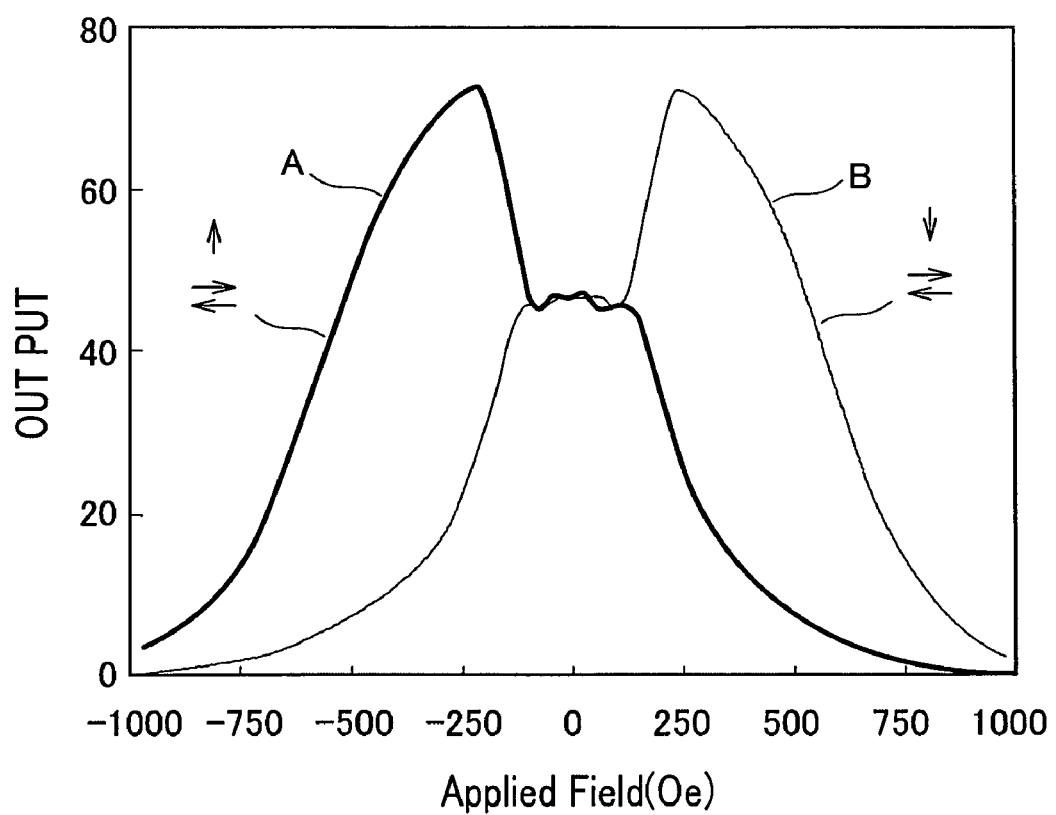
FIG. 29 is a graph, in the case of an element of fair quality, formed by integrating a graph of the line A (bold line) given by measuring the output waveform of the element in response to an external magnetic field in the first magnetization forming mode state and a graph of the line B (thin line) given by measuring the output waveform of the element in response to an external magnetic field in the second magnetization forming mode state, both of which are drawn at the same time, the integrated graph showing the symmetrical relationship using as reference the longitudinal axis where the applied magnetic field is zero.

The output waveform of this element of fair quality is measured in response to an external magnetic field in the first magnetization forming mode as shown in FIG. 13. As a result, a graph as shown in FIG. 29 by the line A (bold line) is given. Next, as shown in FIG. 15, the output waveform of the element is measured in response to an external magnetic field in the second magnetization forming mode. As a result, a graph as shown in FIG. 29 by the line B (thin line) is given. The graph having the line A (bold line) and the graph having the line B (thin line) in FIG. 29 are drawn at the same time and integrated. As a result, the integrated graph shows a symmetrical relationship using as reference the longitudinal axis where the applied magnetic field is zero. In other words, it has a mirror-image relationship using as reference the longitudinal axis where the applied magnetic field is zero. Here, the reason why a bold line is used for the line A and a thin line for the line B is only to distinguish between the line A and the line B clearly.

Figure 30:
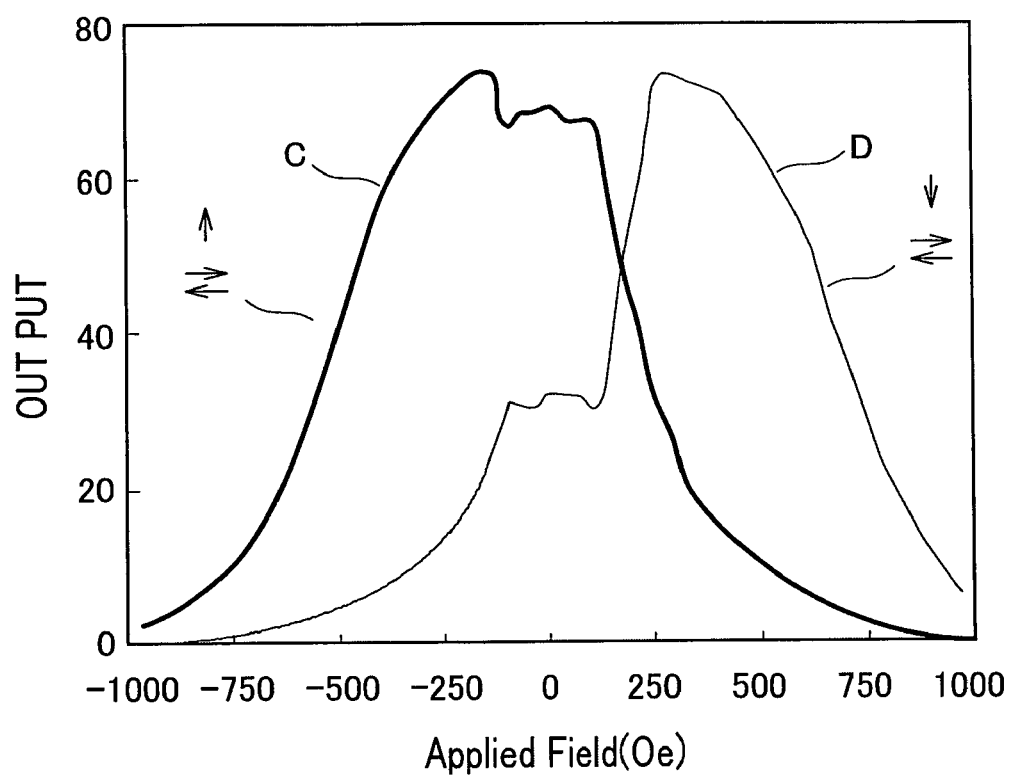
FIG. 30 is a graph, in the case of a defective element, formed by integrating a graph of the line C (bold line) given by measuring the output waveform of the element in response to an external magnetic field in the first magnetization forming mode state and a graph of the line D (thin line) given by measuring the output waveform of the element in response to an external magnetic field in the second magnetization forming mode state, both of which are drawn at the same time, the integrated graph not showing a symmetrical relationship using as reference the longitudinal axis where the applied magnetic field is zero.

Next, a description of a defective element is given below. As shown in FIG. 22, for example, a defective element in which the magnetization directions 131 and 151 of the first ferromagnetic layer 30 and the second ferromagnetic layer 50, both of which function as free layers, respectively, are not antiparallel to each other in the track width direction before the orthogonalizing bias function part starts functioning. The output waveform of this defective element is measured in response to an external magnetic field in the first magnetization forming mode as shown in FIG. 23. As a result, a graph as shown in FIG. 30 by the line C (bold line) is given. As shown in FIG. 25, the output waveform of the element is measured in response to an external magnetic field in the second magnetization forming mode. As a result, a graph as shown in FIG. 30 by the line D (thin line) is given. When the graph having the line C (bold line) and the graph having the line D (thin line) in FIG. 30 are drawn at the same time and integrated, the integrated graph does not show a symmetrical relationship using as reference the longitudinal axis where the applied magnetic field is zero. A mirror-image relationship is not obtained using as reference the longitudinal axis where the applied magnetic field is zero. Here, the reason why a bold line is used for the line C and a thin line for the line D is only to distinguish between the line C and the line D clearly.

The above-mentioned examination method according to the present invention could be any one of the following: (0) an examination method in the wafer processing completion state for a plurality of specific MR elements selected from a group of MR elements disposed and formed on a wafer substrate in the matrix state as examination objects; (1) an examination method in the cutout bar state for a plurality of specific MR elements selected from a group of MR elements existing in a cutout bar as examination objects, wherein a group of MR elements disposed and formed on a wafer substrate in the matrix state is cut into multiple bars; (2) an examination method in the slider state, wherein one MR element is contained in a slider; and (3) an examination method in the head gimbal assembly, wherein a head gimbal assembly has a slider containing one MR element and a suspension elastically supporting the slider.

It is desirable to find defective elements on the early stage of the manufacture processing in terms of an enhanced production yield. Accordingly, the most preferred examination method is one in the wafer processing completion state or in the cutout bar state.

A description of a schematic flow diagram of the steps of manufacturing a thin film magnetic head is briefly given below in order to facilitate the understanding of the difference in the above-mentioned examination periods with reference to FIG. 31.

[Explanation of a Schematic Flow Diagram of the Steps of Manufacturing a Thin Film Magnetic Head]

Figure 31:
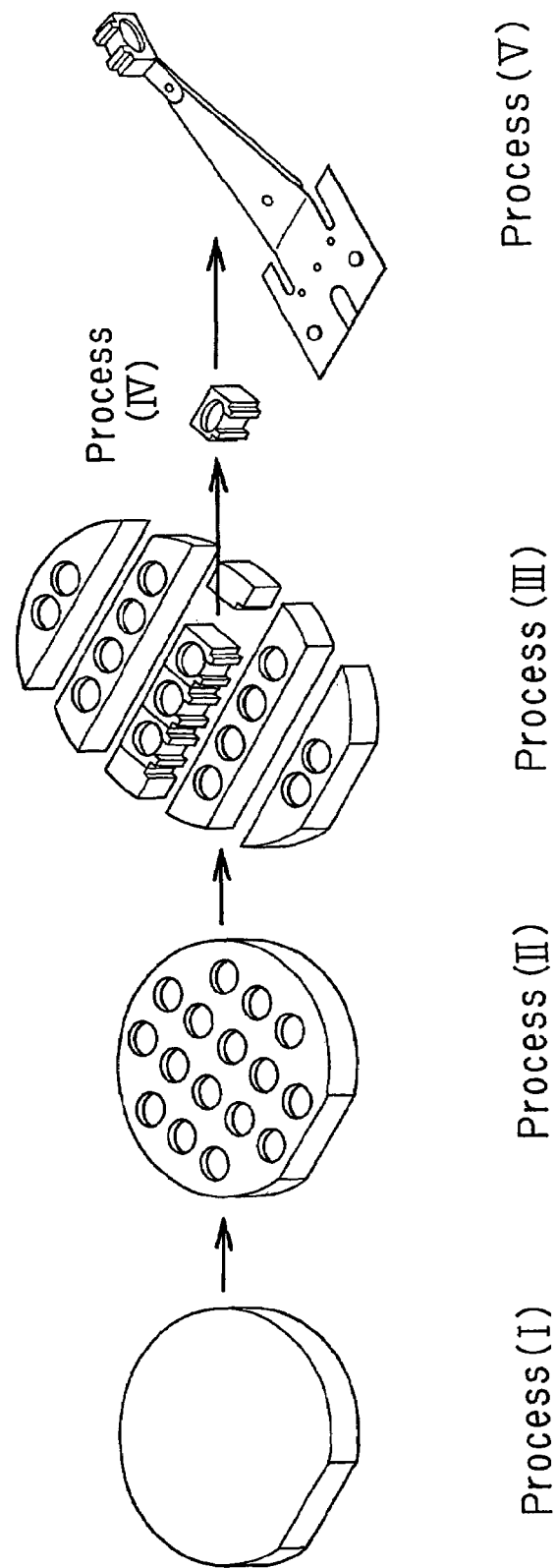
FIG. 31 is a diagram sequentially explaining the production process of a thin film magnetic head.

A thin film magnetic head is usually manufactured by the manufacturing steps of a thin film magnetic head as shown in FIG. 31. In other words, a wafer is prepared as the first process (Process (I)) in FIG. 31.

Next, the above-mentioned laminated films constituting the thin film magnetic head are formed on this wafer. Then, multiple head elements are formed on a sheet of this wafer (Process (II) in FIG. 31). In other words, a wafer body is formed, wherein multiple MR elements are formed on the wafer (the wafer processing completion state).

Next, this wafer body is cut out. In other words, multiple bar bodies are cut out from the wafer body (Process (III) in FIG. 31).

Next, multiple element bodies are cut out from a bar body to form a slider head element (one head element constitution) (Process (IV) in FIG. 31).

Next, a slider head element is mounted on a gimbal to form a head gimbal assembly (Process (V) in FIG. 31).

Specific Experimental Embodiment

A description of a specific experimental embodiment is given below for the MR element according to the present invention in order to explain the invention in more detail.

A group of MR elements disposed and formed on a wafer substrate in the matrix state is cut into multiple bars (See Process (III) in FIG. 31).

An examination is conducted according to the present invention in the cutout bar state for a plurality of specific MR elements selected from a group of MR elements existing in a cutout bar as examination objects.

In other words, the first magnetization forming mode (ABS in magnetization) as shown in FIG. 13 was not carried out for each element in the cutout bar state as shown in Process (III) in FIG. 31, wherein the magnetization direction of the orthogonalizing bias function part 90 is from anterior side of an element (i.e., ABS side) to the posterior side thereof (as shown by the reference numeral 91). Quasi-Static Test (QST) was conducted for a plurality of specific MR elements selected as examination objects. The applied magnetic field was 600Oe, and the measured voltage was 150 mV.

As a result, graphs having the output waveform as shown in FIG. 14 were given for all the elements, and it was judged that asymmetry was zero (Asymmetry=0).

Next, the second magnetization forming mode (ABS out magnetization) as shown in FIG. 15 as carried out for each element in the cutout bar state, wherein the magnetization direction of the orthogonalizing bias function part 90 is from posterior side of an element to the anterior side thereof (as shown by the reference numeral 93). QST was conducted for a plurality of specific MR elements selected as examination objects. The applied magnetic field was 600Oe, and the measured voltage was 150 mV.

As a result, graphs having the output waveform as shown in FIG. 16 were given for all the elements, and it was judged that asymmetry was zero (Asymmetry=0).

In addition to the above-mentioned checking of the asymmetry of output waveforms, the output waveforms of both graphs as shown in FIG. 14 and FIG. 16 were drawn at the same time and integrated them in order to judge whether or not the integrated graph has a symmetric relationship (i.e., whether or not there is a mirror-image relationship) using as reference the longitudinal axis where the applied magnetic field is zero. The integrated graph had a symmetric relationship using as reference the longitudinal axis where the applied magnetic field is zero.

MR elements in the bar state, which had been judged to be of fair quality as a result of the above-mentioned examination, were cut into slider head elements (each of which had a head element constitution.) Then, each of the slider head elements were mounted on a gimbal to form a head gimbal assembly, which was in turn incorporated it into a magnetic head device. There was no particular problem in the detection operation.

A slider head element was mounted to be examined, which had been judged to be defective (as shown in FIG. 17~FIG. 26), on a gimbal to form a head gimbal assembly, which was in turn incorporated into a magnetic head device. There was a problem in the detection operation.

The effect of the present invention is obvious from the above-mentioned experimental results.

In other words, the examination method according to the present invention is structured of changing the magnetization direction of the orthogonalizing bias function part disposed on the rear side of an MR effect part between a first magnetization forming mode, wherein the magnetization direction is from the anterior side of the element to the posterior side thereof, and a second magnetization forming mode, wherein the magnetization direction is from the posterior side of the element to the anterior side thereof, measuring the output waveform of the element in response to an external magnetic field for each magnetization forming mode and checking the state of the output waveforms of both modes in order to examine whether or not the magnetization directions of the first magnetic layer and the second magnetic layer, both of which functions as free layers, are antiparallel to each other in the track width direction before the orthogonalizing bias function part starts functioning. Therefore, it is possible to easily examine whether or not the antiparallel state is surely formed between the magnetization directions of two free layers before the orthogonalizing bias function part starts functioning.

Regarding the industrial feasibility of the present invention, the present invention can be used in the industry of magnetic disk devices equipped with an MR element for reading the magnetic strength of magnetic recording media and the like as signals.

What is claimed is:

1. An examination method for a magnetoresistance (MR) effect element comprising an MR effect part having a non magnetic middle layer, a first ferromagnetic layer that functions as a free layer and a second ferromagnetic layer that functions as a free layer, wherein the first and second ferromagnetic layers are laminated in a manner of sandwiching the nonmagnetic middle layer, the MR element comprising a Current Perpendicular to Plane (CPP) structure, wherein a sense current is applied to the MR effect part in the laminating direction, and wherein an orthogonalizing bias function part is formed on a rear part of the MR effect part in order to influence the action of substantially orthogonalizing the magnetization directions of the first ferromagnetic layer and the second ferromagnetic layer, the examination method being structured for:

changing the magnetization direction of the orthogonalizing bias function part between a first magnetization forming mode, wherein the magnetization direction is from the anterior side of the element to the posterior side thereof, and a second magnetization forming mode, wherein the magnetization direction is from the posterior side of the element to the anterior side thereof, measuring the output waveform of the element in response to an external magnetic field for each magnetization forming mode, and checking the state of the output waveforms of both modes in order to examine whether or not the magnetization directions of the first magnetic layer and the second magnetic layer, both of which functions as free layers, are antiparallel to each other in the track width direction before the orthogonalizing bias function part starts functioning.

2. The examination method for the MR effect element according to claim 1, wherein examining whether or not the magnetization directions of the first ferromagnetic layer and the second ferromagnetic layer, both of which functions as free layers, are antiparallel to each other in the track width direction before the orthogonalizing bias function part starts functioning by checking the asymmetry of the output waveform for each mode.

3. The examination method for the MR effect element according to claim 1, wherein examining whether or not the magnetization directions of the first ferromagnetic layer and the second ferromagnetic layer, both of which functions as free layers, are antiparallel to each other in the track width direction before the orthogonalizing bias function part starts functioning by drawing graphs of output waveforms for both modes at the same time, integrating them and then judging whether or not the integrated graphs are symmetry (i.e., whether or not there is a mirror-image relationship) using as reference the longitudinal axis where the applied magnetic field is zero.

4. The examination method for the MR effect element according to claim 1, wherein the examination is conducted up to the wafer processing completion state for a plurality of specific MR elements selected as examination objects from a group of MR elements disposed and formed on a wafer substrate in the matrix state.

5. The examination method for the MR effect element according to claim 1, wherein a group of MR elements disposed and formed on a wafer substrate in the matrix state is cut into multiple bars, and then the examination is conducted, in the cutout bar state, for a plurality of specific MR elements selected as examination objects from a group of the MR elements in a cutout bar.

6. The examination method for the MR effect element according to claim 1, wherein the examination is conducted for a slider comprising one MR element.

7. The examination method for the MR effect element according to claim 1, wherein the examination is conducted for a head gimbal assembly comprising a slider containing one MR element and a suspension that elastically supports the slider.

8. The examination method for the MR effect element according to claim 1, wherein a first magnetization mode from the anterior side of the element to the posterior side thereof is structured so that the magnetized magnetization direction is oriented toward the posterior side, back area of the element, from an air-bearing-surface (ABS), and wherein a second magnetization mode from the posterior side of the element to the anterior side thereof is structured so that the magnetized magnetization direction is oriented toward the ABS from the posterior side, back area of the element.

9. The examination method for the MR effect element according to claim 8, wherein the magnetization directions of the first magnetization mode from the anterior side of the element to the posterior side thereof and the second magnetization mode from the posterior side of the element to the anterior side thereof are perpendicular to the ABS.

10. The examination method for the MR effect element according to claim 1, wherein the first ferromagnetic layer that functions as a free layer and the second ferromagnetic layer that functions as a free layer are exchange-coupled via the nonmagnetic middle layer so that their magnetization directions are antiparallel to each other.

11. The examination method the MR effect element according to claim 1, wherein the magnetization directions of the first ferromagnetic layer that functions as a free layer and the second ferromagnetic layer that functions as a free layer are controlled by a magnetization direction control part of the first ferromagnetic layer and another magnetization direction control part of the second ferromagnetic layer respectively disposed on the upper and lower portions of the MR effect part, so that the magnetization directions of the first ferromagnetic layer and the second ferromagnetic layer are substantially antiparallel to each other.

12. The examination method for the MR effect element according to claim 1, wherein the orthogonalizing bias function part is structured of a hard magnet, and a magnetization operation is used as a method for changing the magnetization direction between the first magnetization forming mode and the second magnetization forming mode.

13. The examination method for the MR effect element according to claim 1, wherein the orthogonalizing bias function part is structured of a laminated body comprising an antiferromagnetic layer and a ferromagnetic layer, and the annealing process in the magnetic filed is used as a method for changing the magnetization direction between the first magnetization forming mode and the second magnetization forming mode.

14. The examination method for the MR effect element according to claim 1, wherein the magnetization directions of the first magnetization forming mode and the second magnetization forming mode are opposite relative to one another.

15. An examination method for a magnetic head comprising the MR effect element according to claim 1, the examination being conducted in the manner according to claim 1 for the MR element structuring a magnetic head.

* * * * *